US010031701B2

(12) United States Patent
Best et al.

(10) Patent No.: US 10,031,701 B2
(45) Date of Patent: Jul. 24, 2018

(54) HIERARCHICAL PROCESSING FOR EXTENDED PRODUCT CODES

(71) Applicant: International Business Machines Corporation, Armonk, NY (US)

(72) Inventors: John S. Best, San Jose, CA (US); Mario Blaum, San Jose, CA (US); Steven R. Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 15/019,633

(22) Filed: Feb. 9, 2016

(65) Prior Publication Data

US 2017/0228283 A1   Aug. 10, 2017

(51) Int. Cl.
| | |
|---|---|
| *G11C 29/00* | (2006.01) |
| *G06F 3/06* | (2006.01) |
| *H03M 13/29* | (2006.01) |
| *H03M 13/37* | (2006.01) |
| *G06F 11/10* | (2006.01) |
| *H03M 13/11* | (2006.01) |
| *H03M 13/15* | (2006.01) |

(52) U.S. Cl.
CPC ............ *G06F 3/0688* (2013.01); *G06F 3/064* (2013.01); *G06F 3/0619* (2013.01); *G06F 11/1012* (2013.01); *G06F 11/1076* (2013.01); *H03M 13/2909* (2013.01); *H03M 13/373* (2013.01); *H03M 13/3761* (2013.01); *H03M 13/1102* (2013.01); *H03M 13/152* (2013.01); *H03M 13/1515* (2013.01)

(58) Field of Classification Search
CPC .. G06F 11/1068; G06F 3/0688; G06F 3/0619; G06F 3/064; G11C 29/52; H03M 13/2909; H03M 13/154
See application file for complete search history.

(56) References Cited

U.S. PATENT DOCUMENTS

| | | |
|---|---|---|
| 9,058,291 B2 | 6/2015 | Blaum et al. |
| 2008/0016435 A1 | 1/2008 | Goel |
| 2008/0034269 A1* | 2/2008 | Hwang ............. G11B 20/1833 714/756 |

(Continued)

OTHER PUBLICATIONS

IBM, "Stretch Codes: A System and Method for Boosting Storage Efficiency in RAID Systems", Mar. 17, 2004, pp. 1-5, IP.com, United States.

(Continued)

*Primary Examiner* — Thien Nguyen
(74) *Attorney, Agent, or Firm* — Sherman IP LLP; Kenneth L. Sherman; Steven Laut

(57) ABSTRACT

A method for hierarchical correction coding includes converting data for a storage system into w storage device arrays, each storage device array including n storage devices, and each storage device divided into m sectors or pages. The n storage devices are grouped into l groups of t storage devices each. Erasures in the w storage device arrays are corrected based on protecting each row and column in each m×n array by an erasure-correcting code. Each group of t storage devices contains extra parities to correct extra erasures in addition to erasures corrected by vertical parities in each m×t subarray, and w, n, m, l and t are positive integers.

20 Claims, 31 Drawing Sheets

(56) References Cited

U.S. PATENT DOCUMENTS

| | | | | |
|---|---|---|---|---|
| 2012/0221920 A1* | 8/2012 | Blaum | ............... | G06F 11/108 |
| | | | | 714/758 |
| 2012/0246546 A1* | 9/2012 | Melliar-Smith | .. | H03M 13/2921 |
| | | | | 714/776 |
| 2013/0205181 A1* | 8/2013 | Blaum | ............. | G06F 11/1076 |
| | | | | 714/763 |
| 2014/0310571 A1* | 10/2014 | Fetterly | ............ | G06F 11/1088 |
| | | | | 714/764 |
| 2014/0380126 A1* | 12/2014 | Yekhanin | ............. | G06F 11/10 |
| | | | | 714/766 |
| 2015/0006990 A1* | 1/2015 | Wang | .............. | H03M 13/152 |
| | | | | 714/755 |
| 2015/0121169 A1 | 4/2015 | Iliadis et al. | | |

OTHER PUBLICATIONS

Anonymously, "Expanded Sub Data Set for Magnetic Tape Recording", Nov. 13, 2012, pp. 1-6, IP.com, United States.

Anonymously, "Systematic LDPC Encoding with Distributed Parity for Magnetic and Optical Storage Devices", Jul. 3, 2012, pp. 1-6, IP.com, United States.

Mell, P., et al., "The NIST Definition of Cloud Computing", National Institute of Standards and Technology Special Publication 800-145, Sep. 2011, pp. 1-7, U.S. Department of Commerce, United States.

List of IBM Patents or Applications Treated as Related, filed Apr. 30, 2018, U.S. Appl. No. 15/967,350.

* cited by examiner $$H^{(1)}_{m,n,\ell} = \begin{pmatrix} I_m \otimes \overbrace{(1\ 1\ ...\ 1)}^{n} \\ \hline \overbrace{(1\ 1\ ...\ 1)}^{m} \otimes I_n \\ \hline (1\ \alpha^{-1}\ \alpha^{-2}\ ...\ \alpha^{-(m-2)}\ 0) \otimes (I_\ell \otimes (1\ \alpha^{-1}\ \alpha^{-2}\ ...\ \alpha^{-(t-1)})) \end{pmatrix} \quad \text{Eq. 1}$$

$$H_0 = \begin{pmatrix} 1 & 1 & 1 & 1 & 1 & 1 & 1 & 1 \\ 0 & 0 & 0 & 0 & 0 & 0 & 0 & 0 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline 1 & \alpha^6 & \alpha^5 & \alpha^4 & 0 & 0 & 0 & 0 \\ 0 & 0 & 0 & 0 & 1 & \alpha^6 & \alpha^5 & \alpha^4 \end{pmatrix}$$

$$H_1 = \begin{pmatrix} 0 & 0 & 0 & 0 & 0 & 0 & 0 & 0 \\ 1 & 1 & 1 & 1 & 1 & 1 & 1 & 1 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^6 & \alpha^5 & \alpha^4 & \alpha^3 & 0 & 0 & 0 & 0 \\ 0 & 0 & 0 & 0 & \alpha^6 & \alpha^5 & \alpha^4 & \alpha^3 \end{pmatrix}$$

$$H_2 = \begin{pmatrix} 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline 0 & 0 & 0 & 0 & 0 & 0 & 0 & 0 \\ 0 & 0 & 0 & 0 & 0 & 0 & 0 & 0 \end{pmatrix}$$

$$\tilde{H}^{(1)}_{m,n,\ell} = \begin{pmatrix} I_m \otimes \overbrace{(1\ 1\ \ldots\ 1)}^{n} \\ \hline \overbrace{(1\ 1\ \ldots\ 1)}^{m} \otimes I_n \\ \hline \left(1\ \alpha^{-1}\ \alpha^{-2}\ \ldots\ \alpha^{-(m-1)}\right) \otimes \left(I \otimes \left(1\ \alpha^{-1}\ \alpha^{-2}\ \ldots\ \alpha^{-(\ell-1)}\right)\right) \end{pmatrix}$$  Eq. 2

FIG. 10

$$\tilde{H}_2 = \begin{pmatrix} 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^5 & \alpha^4 & \alpha^3 & \alpha^2 & 0 & 0 & 0 & 0 \\ 0 & 0 & 0 & 0 & \alpha^5 & \alpha^4 & \alpha^3 & \alpha^2 \end{pmatrix}$$ 1100

FIG. 11

$$S^{(V)}_{u,j_0} = \bigoplus_{i=0}^{m-1} a_{i,ut+j_0}$$  Eq. 3

$$S^{(L)}_u = \bigoplus_{i=0}^{m-2} \bigoplus_{j=0}^{t-1} \alpha^{-i-j} a_{i,ut+j}$$  Eq. 4

FIG. 12

$$S_{i_0}^{(H)} = \bigoplus_{j=0}^{n-1} a_{i_0,j} \qquad \text{Eq. 5}$$

$$S_{i_1}^{(H)} = \bigoplus_{j=0}^{n-1} a_{i_1,j} \qquad \text{Eq. 6}$$

$$S_{u,j_1}^{(V)} = \bigoplus_{i=0}^{m-1} a_{i,ut+j_1} \qquad \text{Eq. 7}$$

$$S_u^{(L)} = \bigoplus_{i=0}^{m-2} \bigoplus_{j=0}^{t-1} \alpha^{-i-j} a_{i,ut+j} \qquad \text{Eq. 8}$$

FIG. 13

| D | D | D | D | D | D | H | H |
|---|---|---|---|---|---|---|---|
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | D | D | D | H | H |
| D | D | D | L | D | L | H | H |
| V | V | V | V | V | V | H | H |

$$H^{(2)}_{m,n,\ell} = \begin{pmatrix} I_m \otimes \begin{pmatrix} 1 & 1 & 1 & \ldots & 1 \\ 1 & \alpha & \alpha^2 & \ldots & \alpha^{n-1} \end{pmatrix} \\ \hline (\overbrace{1\ 1\ \ldots\ 1}^{m}) \otimes I_n \\ \hline (1\ \alpha^{-1}\ \alpha^{-2}\ \ldots\ \alpha^{-(m-2)}\ 0) \otimes (I_\ell \otimes (1\ \alpha^{-1}\ \alpha^{-2}\ \ldots\ \alpha^{-(\ell-1)})) \end{pmatrix}$$

$$H_0 = \begin{pmatrix} 1 & 1 & 1 & 1 & 1 & 1 & 1 & 1 \\ 1 & \alpha & \alpha^2 & \alpha^3 & \alpha^4 & \alpha^5 & \alpha^6 & \alpha^7 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline 1 & \alpha^6 & \alpha^5 & \alpha^4 & 0 & 0 & 0 & 0 \\ 0 & 0 & 0 & 0 & 1 & \alpha^6 & \alpha^5 & \alpha^4 \end{pmatrix}$$

$$H_1 = \begin{pmatrix} 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ 1 & \alpha & \alpha^2 & \alpha^3 & \alpha^4 & \alpha^5 & \alpha^6 & \alpha^7 \\ 0 & 0 & 0 & 0 & 0 & 0 & 0 & 0 \\ 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \alpha^6 & \alpha^5 & \alpha^4 & \alpha^3 & 0 & 0 & 0 & 0 \\ 0 & 0 & 0 & 0 & \alpha^6 & \alpha^5 & \alpha^4 & \alpha^3 \end{pmatrix}$$

$$H_2 = \begin{pmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ 1 & \alpha & \alpha^2 & \alpha^3 & \alpha^4 & \alpha^5 & \alpha^6 & \alpha^7 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 0 & 0 & 0 & 0 & 0 & 0 & 0 & 0 \\ 0 & 0 & 0 & 0 & 0 & 0 & 0 & 0 \end{pmatrix}$$

[Figure 17: Grid 1700 with cells marked "E" at positions (row 1: cols 1,2,4) and (row 3: cols 1,2,4)]

FIG. 17

$$\widetilde{H}^{(2)}_{m,n,\ell} = \begin{pmatrix} I_m \otimes \begin{pmatrix} 1 & 1 & 1 & \ldots & 1 \\ 1 & \alpha & \alpha^2 & \ldots & \alpha^{n-1} \end{pmatrix} \\ \hline (\overbrace{1\ 1\ \ldots\ 1}^{m}) \otimes I_n \\ \hline \left(1\ \alpha^{-1} \ldots\ \alpha^{-(m-2)}\ \alpha^{-(m-1)}\right) \otimes \left(I_\ell \otimes \left(1\ \alpha^{-1}\ \alpha^{-2} \ldots\ \alpha^{-(t-1)}\right)\right) \end{pmatrix}$$ Eq. 10

FIG. 18

$$\widetilde{H}_2 = \begin{pmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ 1 & \alpha & \alpha^2 & \alpha^3 & \alpha^4 & \alpha^5 & \alpha^6 & \alpha^7 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^5 & \alpha^4 & \alpha^3 & \alpha^2 & 0 & 0 & 0 & 0 \\ 0 & 0 & 0 & 0 & \alpha^5 & \alpha^4 & \alpha^3 & \alpha^2 \end{pmatrix}$$

$$H_{m,n,\ell,w} = \left( \begin{array}{c} I_w \otimes H^{(1)}_{m,n,\ell} \\ \hline (\underbrace{1\ 1\ 1\ \ldots\ 1}_{w}) \otimes \left( I_m \otimes \begin{pmatrix} 1 & \alpha & \alpha^2 & \ldots & \alpha^{n-1} \end{pmatrix} \right) \end{array} \right), \quad \text{Eq. 11}$$

FIG. 21

| Binary | Hexadecimal |
|--------|-------------|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | A |
| 1011 | B |
| 1100 | C |
| 1101 | D |
| 1110 | E |
| 1111 | F |

| Vector | Log | Vector | Log | Vector | Log | Vector | Log |
|---|---|---|---|---|---|---|---|
| 33 | 127 | CE | 159 | 82 | 191 | 90 | 223 |
| A1 | 128 | 67 | 160 | 41 | 192 | 48 | 224 |
| E8 | 129 | 8B | 161 | 98 | 193 | 24 | 225 |
| 74 | 130 | FD | 162 | 4C | 194 | 12 | 226 |
| 3A | 131 | C6 | 163 | 26 | 195 | 09 | 227 |
| 1D | 132 | 63 | 164 | 13 | 196 | BC | 228 |
| B6 | 133 | 89 | 165 | B1 | 197 | 5E | 229 |
| 5B | 134 | FC | 166 | E0 | 198 | 2F | 230 |
| 95 | 135 | 7E | 167 | 70 | 199 | AF | 231 |
| F2 | 136 | 3F | 168 | 38 | 200 | EF | 232 |
| 79 | 137 | A7 | 169 | 1C | 201 | CF | 233 |
| 84 | 138 | EB | 170 | 0E | 202 | DF | 234 |
| 42 | 139 | CD | 171 | 07 | 203 | D7 | 235 |
| 21 | 140 | DE | 172 | BB | 204 | D3 | 236 |
| A8 | 141 | 6F | 173 | E5 | 205 | D1 | 237 |
| 54 | 142 | 8F | 174 | CA | 206 | D0 | 238 |
| 2A | 143 | FF | 175 | 65 | 207 | 68 | 239 |
| 15 | 144 | C7 | 176 | 8A | 208 | 34 | 240 |
| B2 | 145 | DB | 177 | 45 | 209 | 1A | 241 |
| 59 | 146 | D5 | 178 | 9A | 210 | 0D | 242 |
| 94 | 147 | D2 | 179 | 4D | 211 | BE | 243 |
| 4A | 148 | 69 | 180 | 9E | 212 | 5F | 244 |
| 25 | 149 | 8C | 181 | 4F | 213 | 97 | 245 |
| AA | 150 | 46 | 182 | 9F | 214 | F3 | 246 |
| 55 | 151 | 23 | 183 | F7 | 215 | C1 | 247 |
| 92 | 152 | A9 | 184 | C3 | 216 | D8 | 248 |
| 49 | 153 | EC | 185 | D9 | 217 | 6C | 249 |
| 9C | 154 | 76 | 186 | D4 | 218 | 36 | 250 |
| 4E | 155 | 3B | 187 | 6A | 219 | 1B | 251 |
| 27 | 156 | A5 | 188 | 35 | 220 | B5 | 252 |
| AB | 157 | EA | 189 | A2 | 221 | E2 | 253 |
| ED | 158 | 75 | 190 | 51 | 222 | 71 | 254 |

FIG. 25

$$a_{m-1,j}^{(u)} = \bigoplus_{i=0}^{m-2} a_{i,j}^{(u)} \qquad \text{Eq. 12}$$

FIG. 26

$$S_i^{(H),u} = S_i^{(H),u} \oplus a_{i,j}^{(u)} \quad \text{for} \quad 0 \leq i \leq m-1 \qquad \text{Eq. 13}$$

$$S_{j'}^{(L),u} = S_{j'}^{(L),u} \oplus \alpha^{-(j-j't)} \bigoplus_{i=0}^{m-2} \alpha^{-i} a_{i,j}^{(u)} \qquad \text{Eq. 14}$$

$$S_i^{(S)} = S_i^{(S)} \oplus \alpha^j a_{i,j}^{(u)} \quad \text{for} \quad 0 \leq i \leq m-1 \qquad \text{Eq. 15}$$

$$S_j^{(V),u} = \bigoplus_{i=0}^{m-3} a_{i,j}^{(u)} \qquad \text{Eq. 16}$$

$$S_{j'}^{(L),u} = S_{j'}^{(L),u} \oplus \alpha^{-(j-j't)} \bigoplus_{i=0}^{m-3} \alpha^{-i} a_{i,j}^{(u)} \qquad \text{Eq. 17}$$

$$a_{m-2,j}^{(u)} = \alpha^{m+(j-j't)-2} S_{j'}^{(L),u} \qquad \text{Eq. 18}$$

$$a_{m-1,3}^{(u)} = a_{m-2,j}^{(u)} \oplus S_j^{(V),u} \qquad \text{Eq. 19}$$

$$a_{i,n-1}^{(u)} = S_i^{(H),u} \oplus a_{i,n-2}^{(u)} \quad \text{for} \quad 0 \leq i \leq m-3, \qquad \text{Eq. 20}$$

$$S_{n-1}^{(V),u} = \bigoplus_{i=0}^{m-3} a_{i,n-1}^{(u)} \qquad \text{Eq. 21}$$

$$S_{\ell-1}^{(L),u} = S_{\ell-1}^{(L),u} \oplus \alpha^{-(t-2)} \left( \bigoplus_{i=0}^{m-3} \alpha^{-i} \left( a_{i,n-2}^{(u)} \oplus \alpha^{-1} a_{i,n-1}^{(u)} \right) \right) \qquad \text{Eq. 22}$$

FIG. 27

$$a^{(u)}_{m-1,n-1} = \frac{(1\oplus\alpha)S^{(V),u}_{n-1}\oplus\alpha S^{(H),u}_{m-2}\oplus\alpha^{m+t-3}S^{(L),u}_{\ell-1}}{1\oplus\alpha} \quad \text{Eq. 23}$$

$$a^{(u)}_{m-1,n-2} = a^{(u)}_{m-1,n-1}\oplus S^{(H),u}_{m-1} \quad \text{Eq. 24}$$

$$a^{(u)}_{m-2,n-1} = a^{(u)}_{m-1,n-1}\oplus S^{(V),u}_{n-1} \quad \text{Eq. 25}$$

$$a^{(u)}_{m-2,n-2} = a^{(u)}_{m-2,n-1}\oplus S^{(H),u}_{m-2} \quad \text{Eq. 26}$$

$$S^{(S)}_i = S^{(S)}_i \oplus \alpha^{n-2} a^{(u)}_{i,n-2} \oplus \alpha^{n-1} a^{(u)}_{i,n-1} \quad \text{for} \quad 0 \le i \le m-1 \quad \text{Eq. 27}$$

$$S^{(H),w-1}_i = S^{(H),w-1}_i \oplus a^{(w-1)}_{i,n-3} \quad \text{for} \quad 0 \le i \le m-3 \quad \text{Eq. 28}$$

$$S^{(S)}_i = S^{(S)}_i \oplus \alpha^{n-3} a^{(w-1)}_{i,n-3} \quad \text{for} \quad 0 \le i \le m-3 \quad \text{Eq. 29}$$

$$a^{(w-1)}_{i,n-2} = \frac{\alpha S^{(H),w-1}_i \oplus \alpha^{-(n-2)} S^{(S)}_i}{1\oplus\alpha} \quad \text{Eq. 30}$$

$$a^{(w-1)}_{i,n-1} = \frac{S^{(H),w-1}_i \oplus \alpha^{-(n-2)} S^{(S)}_i}{1\oplus\alpha} \quad \text{Eq. 31}$$

$$S^{(V),w-1}_{n-2} = \bigoplus_{i=0}^{m-3} a^{(w-1)}_{i,n-2} \quad \text{Eq. 32}$$

$$S^{(V),w-1}_{n-1} = \bigoplus_{i=0}^{m-3} a^{(w-1)}_{i,n-1} \quad \text{Eq. 33}$$

$$S^{(L),w-1}_{\ell-1} = S^{(L),w-1}_{\ell-1} \oplus \alpha^{-(t-3)}\left(\bigoplus_{i=0}^{m-3} \alpha^{-i}\left(a^{(w-1)}_{i,n-3}\oplus\alpha^{-1}a^{(w-1)}_{i,n-2}\oplus\alpha^{-2}a^{(w-1)}_{i,n-1}\right)\right) \quad \text{Eq. 34}$$

FIG. 28

$$\gamma_1 = \alpha^{-m-t+5} S_{m-2}^{(H),w-1} \oplus S_{\ell-1}^{(L),w-1} \qquad \text{Eq. 35}$$

$$\gamma_2 = \alpha^{n-3} S_{m-1}^{(H),w-1} \oplus S_{m-1}^{(S)}. \qquad \text{Eq. 36}$$

$$\gamma_3 = \alpha^{-m-t+4}(1 \oplus \alpha) S_{n-2}^{(V),w-1} \oplus \gamma_1. \qquad \text{Eq. 37}$$

$$\gamma_4 = \alpha^{-m-t+3}(1 \oplus \alpha^2) S_{n-1}^{(V),w-1} \oplus \gamma_3. \qquad \text{Eq. 38}$$

$$\gamma_5 = \frac{\alpha^{m+t-4} \gamma_4}{1 \oplus \alpha} \qquad \text{Eq. 39}$$

$$\gamma_6 = \frac{\gamma_2}{\alpha^{n-3}(1 \oplus \alpha)} \qquad \text{Eq. 40}$$

$$a_{m-1,n-1}^{(w-1)} = \frac{\gamma_5 \oplus \gamma_6}{\alpha \oplus \alpha^{-1}} \qquad \text{Eq. 41}$$

$$a_{m-1,n-2}^{(w-1)} = (1 \oplus \alpha^{-1}) a_{m-1,n-1}^{(w-1)} \oplus \gamma_5 \qquad \text{Eq. 42}$$

$$a_{m-1,n-3}^{(w-1)} = a_{m-1,n-2}^{(w-1)} \oplus a_{m-1,n-1}^{(w-1)} \oplus S_{m-1}^{(H),w-1} \qquad \text{Eq. 43}$$

$$a_{m-2,n-1}^{(w-1)} = a_{m-1,n-1}^{(w-1)} \oplus S_{n-1}^{(V),w-1} \qquad \text{Eq. 44}$$

$$a_{m-2,n-2}^{(w-1)} = a_{m-1,n-2}^{(w-1)} \oplus S_{n-2}^{(V),w-1} \qquad \text{Eq. 45}$$

$$a_{m-2,n-3}^{(w-1)} = a_{m-2,n-2}^{(w-1)} \oplus a_{m-2,n-1}^{(w-1)} \oplus S_{m-2}^{(H),w-1} \qquad \text{Eq. 46}$$

| C4 | FB | B1 | 3B | 27 | 1C | DC |
|---|---|---|---|---|---|---|
| E3 | 26 | 1C | 6D | 17 | 56 | 7D |
| BA | 62 | B6 | 98 | 9D | C6 | D3 |
| 89 | E7 | EA | A1 | B3 | F2 | 46 |
| 9D | 15 | 18 | 0D | 54 | 08 | E7 |
| 21 | F7 | DC | 50 | C7 | 34 | B3 |
| 69 | D1 | 76 | 93 | E2 | 15 | C5 |
| BC | 9C | 18 | C8 | 6D | EB | AC |
| 36 | CB | 7E | 36 | 09 | 46 | FA |
| A3 | 75 | DB | AA | E9 | C5 | 9A |
| E0 | 0B | F7 | A1 | 97 | D3 | 55 |
| 08 | 75 | 39 | 4D | 86 | 3A | 7A |
| 97 | 92 | D2 | C0 | E2 | B3 | 27 |
| 61 | D2 | 8E | EF | 5C | 69 | 99 |
| 72 | 70 | 20 |    | 81 | 54 |    |

1

| EF | 04 | 22 | A4 | AE | 2A | 47 |
|---|---|---|---|---|---|---|
| 60 | 5B | DF | A3 | 0C | 28 | 6B |
| FC | 90 | 30 | 64 | 05 | 26 | 0B |
| 97 | 40 | 41 | AF | AD | 4F | DE |
| 40 | 01 | B8 | 9B | 88 | A0 | 1C |
| 46 | 85 | 63 | 07 | 76 | 0B | 7E |
| DE | 61 | E3 | 96 | 34 | 1A | 99 |
| 42 | 92 | 6A | 46 | 10 | 08 | 89 |
| 9F | 7E | EC | 7C | CC | 34 | EA |
| 64 | 76 | E4 | 0F | 8E | 74 | 34 |
| FD | EE | 5C | C9 | 6F | 5D | 53 |
| CA | 37 | 89 | AB | 20 | 12 | 0A |
| 3D | 9C | 47 | A3 | A8 | AA | 4A |
| 57 | CC | 4F | F7 | 07 | FD | FD |
| D9 | AB | EC |    | 6B | 8C |    |

2

| 5E | B3 | 5B | 03 | BB | E9 | 83 |
|---|---|---|---|---|---|---|
| B9 | 5A | C6 | 59 | 75 | 57 | 60 |
| AF | F4 | F7 | 2A | 5E | 2A | 60 |
| C2 | 1C | F4 | B1 | 20 | CC | 2D |
| 75 | EF | 32 | B4 | 91 | 6A | CE |
| E0 | 4B | 68 | 5A | F8 | 21 | CD |
| 98 | E7 | C3 | F2 | 9F | 42 | 87 |
| 04 | FE | F7 | D9 | FE | 6B | 5C |
| 1D | 50 | F2 | B2 | F0 | 5D | 29 |
| 85 | D8 | CB | DD | 78 | F9 | 7D |
| 83 | 7B | 38 | 9C | FD | 23 | 77 |
| 3F | 5A | 33 | 4B | 8D | 44 | A1 |
| 3F | B6 | B5 | 94 | 8A | 68 | 0D |
| 82 | 8A | 2A | 82 | CD | 9F | 66 |
| 70 | 5B | 99 |    | 58 | D5 |    |

3

| BF | E4 | F8 | B7 | 7F | 64 | A4 |
|---|---|---|---|---|---|---|
| 62 | F6 | A7 | 7C | B7 | A3 | 6D |
| DA | 34 | 77 | 4A | 57 | 1A | 18 |
| 70 | BA | 8D | 8C | C8 | 04 | CD |
| CD | 91 | 40 | 5A | 72 | 86 | 94 |
| 35 | 72 | 0D | BF | 92 | 36 | CF |
| 46 | 49 | 31 | 5F | F0 | 8A | 1F |
| 7A | 75 | 52 | 43 | C1 | 9A | E4 |
| EA | 39 | D9 | F3 | 6A | F1 | 37 |
| 0C | 69 | A9 | 12 | B7 | 85 | 6A |
| 3B | 9D | 51 | D6 | A9 | 8D | 81 |
| 17 | BE | 3F | 72 | 86 | 2D | BE |
| E7 | FA | A2 | 16 | EB | EB | F8 |
| 6C | 63 | DA | E8 | 29 | 0A | A5 |
| 84 | 3E | 11 |    | 69 | 11 |    |

4

| A3 | C5 | 7E | 27 | 46 | F1 |
|---|---|---|---|---|---|
| 18 | 8D | 1E | BB | 33 | 0A |
| 56 | 6F | DC | 1B | A7 | 4A |
| 9C | B4 | DB | 86 | 00 | B1 |
| DF | 5B | 31 | 9B | 9D | 52 |
| 29 | FB | 2B | 40 | CD | 5A |
| E3 | 8D | C5 | 22 | 5A | 99 |
| DC | CC | C3 | 87 | 5B | 41 |
| A4 | 4F | EC | F7 | 40 | C3 |
| 4B | 35 | 00 | F3 | 5E | 50 |
| 08 | DA | 49 | 96 | 69 | 76 |
| 63 | 53 | 86 | 50 | 94 | 67 |
| 2D | 9A | 9E | 39 | 04 | 3F |
| 26 | EE | B6 | B5 | 41 | 74 |
| 82 | 50 | F3 |    | 57 |    |

| 0 | 1 | 2 | 3 | 4 | 5 | 6 | 7 | 0 | 1 | 2 | 3 | 4 | 5 | 6 | 7 |
|---|---|---|---|---|---|---|---|---|---|---|---|---|---|---|---|
| C4 | FB | B1 | 3B | 27 | 1C | DC | 52 | EF | 04 | 22 | A4 | AE | 2A | 47 | AE |
| E3 | 26 | 1C | 6D | 17 | 56 | 7D | 88 | 60 | 5B | DF | A3 | 0C | 28 | 6B | 08 |
| BA | 62 | B6 | 98 | 9D | C6 | D3 | 7E | FC | 90 | 30 | 64 | 05 | 26 | 0B | 10 |
| 89 | E7 | EA | A1 | B3 | F2 | 46 | 22 | 97 | 40 | 41 | AF | AD | 4F | DE | 05 |
| 9D | 15 | 18 | 0D | 54 | 08 | E7 | 26 | 40 | 01 | B8 | 9B | 88 | A0 | 1C | 56 |
| 21 | F7 | DC | 50 | C7 | 34 | B3 | 1A | 46 | 85 | 63 | 07 | 76 | 0B | 7E | A4 |
| 69 | D1 | 76 | 93 | E2 | 15 | C5 | 6F | DE | 61 | E3 | 96 | 34 | 1A | 99 | 7D |
| BC | 9C | 18 | C8 | 6D | EB | AC | DA | 42 | 92 | 6A | 46 | 10 | 08 | 89 | 6D |
| 36 | CB | 7E | 36 | 09 | 46 | FA | 00 | 9F | 7E | EC | 7C | CC | 34 | EA | 63 |
| A3 | 75 | DB | AA | E9 | C5 | 9A | 11 | 64 | 76 | E4 | 0F | 8E | 74 | 34 | 37 |
| E0 | 0B | F7 | A1 | 97 | D3 | 55 | AC | FD | EE | 5C | C9 | 6F | 5D | 53 | E7 |
| 08 | 75 | 39 | 4D | 86 | 3A | 7A | CF | CA | 37 | 89 | AB | 20 | 12 | 0A | E7 |
| 97 | 92 | D2 | C0 | E2 | B3 | 27 | 61 | 3D | 9C | 47 | A3 | A8 | AA | 4A | 0D |
| 61 | D2 | 8E | EF | 5C | 69 | 99 | 7E | 57 | CC | 4F | F7 | 07 | FD | FD | 24 |
| 72 | 70 | 20 | A2 | 81 | 54 | B1 | E4 | D9 | AB | EC | 84 | 6B | 8C | 1D | E0 |
| 84 | 07 | 4C | 94 | CC | 58 | 49 | 86 | 01 | D2 | E7 | 41 | 19 | 06 | A6 | CC |

2 | 3

| 0 | 1 | 2 | 3 | 4 | 5 | 6 | 7 | 0 | 1 | 2 | 3 | 4 | 5 | 6 | 7 |
|---|---|---|---|---|---|---|---|---|---|---|---|---|---|---|---|
| 5E | B3 | 5B | 03 | BB | E9 | 83 | 64 | BF | E4 | F8 | B7 | 7F | 64 | A4 | AB |
| B9 | 5A | C6 | 59 | 75 | 57 | 60 | 3E | 62 | F6 | A7 | 7C | B7 | A3 | 6D | 36 |
| AF | F4 | F7 | 2A | 5E | 2A | 60 | 92 | DA | 34 | 77 | 4A | 57 | 1A | 18 | 86 |
| C2 | 1C | F4 | B1 | 20 | CC | 2D | 5A | 70 | BA | 8D | 8C | C8 | 04 | CD | CA |
| 75 | EF | 32 | B4 | 91 | 6A | CE | 29 | CD | 91 | 40 | 5A | 72 | 86 | 94 | 26 |
| E0 | 4B | 68 | 5A | F8 | 21 | CD | 8D | 35 | 72 | 0D | BF | 92 | 36 | CF | 9E |
| 98 | E7 | C3 | F2 | 9F | 42 | 87 | 14 | 46 | 49 | 31 | 5F | F0 | 8A | 1F | 04 |
| 04 | FE | F7 | D9 | FE | 6B | 5C | 1D | 7A | 75 | 52 | 43 | C1 | 9A | E4 | A1 |
| 1D | 50 | F2 | B2 | F0 | 5D | 29 | 89 | EA | 39 | D9 | F3 | 6A | F1 | 37 | 55 |
| 85 | D8 | CB | DD | 78 | F9 | 7D | B7 | 0C | 69 | A9 | 12 | B7 | 85 | 6A | 86 |
| 83 | 7B | 38 | 9C | FD | 23 | 77 | F5 | 3B | 9D | 51 | D6 | A9 | 8D | 81 | 84 |
| 3F | 5A | 33 | 4B | 8D | 44 | A1 | 75 | 17 | BE | 3F | 72 | 86 | 2D | BE | F1 |
| 3F | B6 | B5 | 94 | 8A | 68 | 0D | 47 | E7 | FA | A2 | 16 | EB | EB | F8 | 51 |
| 82 | 8A | 2A | 82 | CD | 9F | 66 | 94 | 6C | 63 | DA | E8 | 29 | 0A | A5 | BB |
| 70 | 5B | 99 | EF | 58 | D5 | 6C | BC | 84 | 3E | 11 | 54 | 69 | 11 | 03 | 84 |
| 6A | 72 | C4 | 45 | 5F | DB | F3 | EE | 76 | 97 | FC | 1B | DF | 5D | 80 | 04 |

4

| 0 | 1 | 2 | 3 | 4 | 5 | 6 | 7 |
|---|---|---|---|---|---|---|---|
| A3 | C5 | 7E | 27 | 46 | F1 | 38 | B0 |
| 18 | 8D | 1E | BB | 33 | 0A | D6 | DF |
| 56 | 6F | DC | 1B | A7 | 4A | 5A | 49 |
| 9C | B4 | DB | 86 | 00 | B1 | 90 | 54 |
| DF | 5B | 31 | 9B | 9D | 52 | F9 | 18 |
| 29 | FB | 2B | 40 | CD | 5A | F2 | DC |
| E3 | 8D | C5 | 22 | 5A | 99 | 86 | CC |
| DC | CC | C3 | 87 | 5B | 41 | 2D | 63 |
| A4 | 4F | EC | F7 | 40 | C3 | BB | C8 |
| 4B | 35 | 00 | F3 | 5E | 50 | 56 | D5 |
| 08 | DA | 49 | 96 | 69 | 76 | 2C | 3E |
| 63 | 53 | 86 | 50 | 94 | 67 | 8E | 9B |
| 2D | 9A | 9E | 39 | 04 | 3F | 55 | 7E |
| 26 | EE | B6 | B5 | 41 | 74 | F2 | 0C |
| 82 | 50 | F3 | EA | 57 | EA | 4A | 3C |
| B5 | A5 | 83 | DB | 72 | F3 | 26 | EF |

FIG. 31

$$S^{(H),u}_{i_0} = \bigoplus_{j=0}^{n-1} a^{(u)}_{i_0,j} \qquad \text{Eq. 47}$$

$$S^{(H),u}_{i_1} = \bigoplus_{j=0}^{n-1} a^{(u)}_{i_1,j} \qquad \text{Eq. 48}$$

$$S^{(V),u}_{st+j_1} = \bigoplus_{i=0}^{m-1} a^{(u)}_{i,st+j_1} \qquad \text{Eq. 49}$$

$$S^{(V),u}_{st+j_2} = \bigoplus_{i=0}^{m-1} a^{(u)}_{i,st+j_2} \qquad \text{Eq. 50}$$

$$S^{(L),u}_s = \bigoplus_{i=0}^{m-2} \alpha^{-i} \bigoplus_{j=0}^{t-1} \alpha^{-j} a^{(u)}_{i,st+j} \qquad \text{Eq. 51}$$

$$\gamma_1 = \alpha^{-i_0-j_0} S^{(H),u}_{i_0} \oplus S^{(L),u}_s \qquad \text{Eq. 52}$$

$$\gamma_2 = \alpha^{j_0} S^{(H),u}_{i_1} \oplus \alpha^{-st} S^{(S)}_{i_1}. \qquad \text{Eq. 53}$$

$$\gamma_3 = (\alpha^{-i_0-j_0} \oplus \alpha^{-i_0-j_1}) S^{(V),u}_{st+j_1} \oplus \gamma_1. \qquad \text{Eq. 54}$$

$$\gamma_4 = (\alpha^{-i_0-j_0} \oplus \alpha^{-i_0-j_2}) S^{(V),u}_{st+j_2} \oplus \gamma_3. \qquad \text{Eq. 55}$$

$$\gamma_5 = \frac{\alpha^{-i_1-j_0} S^{(H),u}_{i_1} \oplus \gamma_4}{(\alpha^{-i_0} \oplus \alpha^{-i_1})(\alpha^{-j_0} \oplus \alpha^{-j_1})} \qquad \text{Eq. 56}$$

$$\gamma_6 = \frac{\gamma_2}{\alpha^{j_0} \oplus \alpha^{j_1}} \qquad \text{Eq. 57}$$

FIG. 32

$$a^{(u)}_{i_1,st+j_2} = \frac{(\alpha^{j_0} \oplus \alpha^{j_1})(\gamma_5 \oplus \gamma_6)}{(1 \oplus \alpha^{-(j_2-j_1)})(\alpha^{j_0} \oplus \alpha^{j_2})} \quad \text{Eq. 58}$$

$$a^{(u)}_{i_1,st+j_1} = \left(\frac{\alpha^{-j_0} \oplus \alpha^{-j_2}}{\alpha^{-j_0} \oplus \alpha^{-j_1}}\right) a^{(u)}_{i_1,st+j_2} \oplus \gamma_5 \quad \text{Eq. 59}$$

$$a^{(u)}_{i_1,st+j_0} = a^{(u)}_{i_1,st+j_1} \oplus a^{(u)}_{i_1,st+j_2} \oplus S^{(H),u}_{i_1} \quad \text{Eq. 60}$$

$$a^{(u)}_{i_0,st+j_2} = a^{(u)}_{i_1,st+j_2} \oplus S^{(V),u}_{st+j_2} \quad \text{Eq. 61}$$

$$a^{(u)}_{i_0,st+j_1} = a^{(u)}_{i_1,st+j_1} \oplus S^{(V),u}_{st+j_1} \quad \text{Eq. 62}$$

$$a^{(u)}_{i_0,st+j_0} = a^{(u)}_{i_0,st+j_1} \oplus a^{(u)}_{i_0,st+j_2} \oplus S^{(H),u}_{i_0} \quad \text{Eq. 63}$$

$$\gamma_2 = \alpha^{j_0} S^{(H),u}_{m-1} \oplus \alpha^{-st} S^{(S)}_{m-1}. \quad \text{Eq. 64}$$

$$\gamma_5 = \frac{\gamma_2}{\alpha^{j_0} \oplus \alpha^{j_1}} \quad \text{Eq. 65}$$

$$a^{(u)}_{m-1,st+j_2} = \frac{\gamma_2 \oplus \alpha^{i_0+j_0+j_1} \gamma_4}{(\alpha^{j_0} \oplus \alpha^{j_2})(1 \oplus \alpha^{-(j_2-j_1)})} \quad \text{Eq. 66}$$

$$a^{(u)}_{m-1,st+j_1} = \left(\frac{\alpha^{j_0} \oplus \alpha^{j_2}}{\alpha^{j_0} \oplus \alpha^{j_1}}\right) a^{(u)}_{m-1,st+j_2} \oplus \gamma_5 \quad \text{Eq. 67}$$

$$a^{(u)}_{m-1,st+j_0} = a^{(u)}_{m-1,st+j_1} \oplus a^{(u)}_{m-1,st+j_2} \oplus S^{(H),u}_{m-1} \quad \text{Eq. 68}$$

$$a^{(u)}_{i_0,st+j_2} = a^{(u)}_{m-1,st+j_2} \oplus S^{(V),u}_{st+j_2} \quad \text{Eq. 69}$$

$$a^{(u)}_{i_0,st+j_1} = a^{(u)}_{m-1,st+j_1} \oplus S^{(V),u}_{st+j_1} \quad \text{Eq. 70}$$

$$a^{(u)}_{i_0,st+j_0} = a^{(u)}_{i_0,st+j_1} \oplus a^{(u)}_{i_0,st+j_2} \oplus S^{(H),u}_{i_0} \quad \text{Eq. 71}$$

| 3F | A3 | D9 | E6 | 11 | 3F | C4 | 49 | 61 | DC | CD | 2F | 02 |  |  | 85 |
|---|---|---|---|---|---|---|---|---|---|---|---|---|---|---|---|
| A6 | CD | FE | E3 | 06 | 00 | 8C | FC | C1 | EA | 5A | 0A | 37 |  |  | 4E |
| 03 | 7E | B2 | CD | 28 | 91 | A9 | 12 | DC | 87 | 45 | DF | 56 |  |  | 93 |
| E8 | 5B | 2A | 03 | 95 |  | C7 |  | FF | 13 | 68 | 1E |  |  |  | 0D |
| 6C | C3 | D3 | 53 | 36 | 76 | 97 | F8 | 70 | 53 | DC | 21 | 6E |  |  | 13 |
|  |  |  |  | 7E | C1 | 15 | 2E | 8F | 3B | CF | 8A | 33 |  |  | AE |
| F3 | 1E | 54 | 42 | 13 | 6E | A3 | 25 | 7F | 37 | B0 | 48 | 05 |  |  | 86 |
| 90 | FE | 7D | 22 | DE | 37 | 86 | 5E | 49 | 26 | DA | E9 | F2 |  |  | 92 |
| 1E | 1C | 88 | 27 | 46 | 23 | 59 | 91 | C8 | 85 | 18 | E7 | EC |  |  | FB |
| DD | FE | 2B | BD | D4 | 6D | 88 | 84 | 0D | 4B | A1 | D2 | 14 |  |  | 03 |
| 2A | 9B | BB | 9A | 5B | 60 | A3 | 08 | BE | F6 | 9F | D4 | 26 |  |  | 5E |
| 4A | 37 |  | 61 | 36 | F6 | 67 | 51 | E2 | C2 | CD | 32 |  |  |  | CE |
| 28 | 31 | 01 | E8 | 4E | 6C | F0 | 22 | 89 | 91 | 3A | A6 | CE |  |  | 5D |
| 62 | D3 | 69 | B4 | 57 | 5F | BF | DB | 8A | 91 | 8E | 3D | E1 |  |  | AB |
| 01 | CF | F9 | 2B | 1B | 14 | 58 | 4B | 8F | C9 | DA | E4 | BE |  |  | FB |
| AF | 09 | 9E | EA | D2 |  | 83 |  | 5F | E8 | 46 | 42 | 88 |  |  | 99 |

2

| BB | D0 | 39 | 6F | 9D | 01 | 31 | 90 | 54 | 96 | F6 | F8 | 78 | C9 | 9F | E2 |
|---|---|---|---|---|---|---|---|---|---|---|---|---|---|---|---|
| 23 | 69 | CD | 3D | 6D | 5B | D5 | 59 | 6C | B5 | 4B | 59 | 99 | CE | 32 | AE |
|  | DC |  | 70 | 59 | E5 | F8 | 6E | B7 | E4 | F6 | D2 | F8 | DE | 5A | 0B |
| 31 | A9 | 09 | 7B | 9D | 22 | 89 | DC | 4F | 9B | B8 | 50 | 4F | 33 | 0D | 4D |
| D9 | A2 | 5B | C4 | FC | CA | 8B | 59 | 9B | C5 | 78 | 6A | 10 | 91 | A4 | 69 |
| 0C | 95 | 7C | 41 | CC | 06 | 83 | ED | 07 |  |  | 44 |  | AF | F7 | E8 |
|  | DD |  | EC | 86 | 15 | C3 | 81 | 09 | 2F | 45 | F9 | BC | 8F | 6D | C4 |
| 40 | 3A | EC | 0E | BB | BE | BF | 22 | FF | E5 | F9 | C6 | 8F | 12 | C9 | 71 |
| 7E | 49 | C8 | 52 | 00 | 7C | 23 | F2 | 2F |  |  | F3 |  | FC | 5B | 13 |
| 2F | 75 | 4D | 4F | 71 | 71 | 41 | 19 | 48 | 3E | DC | 92 | E1 | 0E | D4 | 03 |
| 32 | FE | 1D | C1 | 22 | FD | 92 | 5D | C6 | 36 | 62 | 0F | 70 | 69 | 79 | FD |
| 71 | B2 | FD | C3 | 5C | 99 | BB | 83 | FC | C9 | 01 | 9C | F4 | C9 | 5F | CA |
| 8C | 56 | 74 | 2D | 58 | C5 | 8B | 95 | BE | 49 | F1 | B5 | A6 | 6E | F6 | 8D |
| 0E | B3 | 29 | 16 | 6F | DA | 01 | 36 | 26 | 1D | BD | 7A | 5A | FF | 16 | 4F |
| 2D | E5 | CE | A3 | 54 | DE | 6C | 43 | 1A | 8D | 21 | 3D | 18 | 11 | 83 | 01 |
| 1D | 6C | 3A | B9 | 55 | 52 | 4C | B9 | 75 | 9B | 0F | 32 | 55 | 9B | C7 | DA |

4

| C1 | 13 | 01 | B3 | BF | 6E | 2E | 9F |
|---|---|---|---|---|---|---|---|
| 95 | 53 | 7A | 8E | 1F | 58 | 43 | 36 |
| 88 | 43 | C5 | E4 | DD | B3 | 1A | 9E |
| 45 | 24 | 91 | 72 | 9D | 43 | 4E | 12 |
| A2 | 81 | 7F | 17 | A7 | 48 | 1E | BA |
| F0 | 04 | 2B | C9 | FA | 77 | D1 | 4A |
| 68 | 70 | D3 | 71 | 2B | 73 | 7D | 9F |
| 09 | CD |  | 5F | 95 |  | 3F | 3A |
| 57 | 95 | B7 | 75 | 3D | C8 | 42 | B7 |
| D4 | 2A | 77 | C2 | 6B | 95 | B0 | 05 |
| E8 | 53 | 2F | 85 | 0C | 88 | 38 | AD |
| 1A | 41 | A3 | 80 | 20 | EC | 20 | 94 |
| 07 | 56 | FC | B1 | 3D | EE | 46 | 89 |
| 5E | 14 | BD | 5B | 7A | 4F | 2C | B5 |
| DC | B5 | 85 | 91 | 49 | 72 | 1C | 5A |
| 5E | 45 |  | 92 | 77 |  | 28 | 9D |

| 3F | A3 | D9 | E6 | 11 | 3F | C4 | 49 | 61 | DC | CD | 2F | 02 | 05 | DD | 85 |
|----|----|----|----|----|----|----|----|----|----|----|----|----|----|----|----|
| A6 | CD | FE | E3 | 06 | 00 | 8C | FC | C1 | EA | 5A | 0A | 37 | D3 | D1 | 4E |
| 03 | 7E | B2 | CD | 28 | 91 | A9 | 12 | DC | 87 | 45 | DF | 56 | 9D | 99 | 93 |
| E8 | 5B | 2A | 03 | 95 | A5 | C7 | 6D | FF | 13 | 68 | 1E | 27 | 57 | E7 | 0D |
| 6C | C3 | D3 | 53 | 36 | 76 | 97 | F8 | 70 | 53 | DC | 21 | 6E | 09 | AA | 13 |
| 3A | 02 | B8 | 04 | 7E | C1 | 15 | 2E | 8F | 3B | CF | 8A | 33 | AA | C6 | AE |
| F3 | 1E | 54 | 42 | 13 | 6E | A3 | 25 | 7F | 37 | B0 | 48 | 05 | 47 | 74 | 86 |
| 90 | FE | 7D | 22 | DE | 37 | 86 | 5E | 49 | 26 | DA | E9 | F2 | 17 | 2B | 92 |
| 1E | 1C | 88 | 27 | 46 | 23 | 59 | 91 | C8 | 85 | 18 | E7 | EC | 33 | 96 | FB |
| DD | FE | 2B | BD | D4 | 6D | 88 | 84 | 0D | 4B | A1 | D2 | 14 | FD | DF | 03 |
| 2A | 9B | BB | 9A | 5B | 60 | A3 | 08 | BE | F6 | 9F | D4 | 26 | 70 | 0B | 5E |
| 4A | 37 | EA | 61 | 36 | F6 | 67 | 51 | E2 | C2 | CD | 32 | 29 | B1 | 89 | CE |
| 28 | 31 | 01 | E8 | 4E | 6C | F0 | 22 | 89 | 91 | 3A | A6 | CE | 49 | 5E | 5D |
| 62 | D3 | 69 | B4 | 57 | 5F | BF | DB | 8A | 91 | 8E | 3D | E1 | A5 | 47 | AB |
| 01 | CF | F9 | 2B | 1B | 14 | 58 | 4B | 8F | C9 | DA | E4 | BE | 11 | 2C | FB |
| AF | 09 | 9E | EA | D2 | 1A | 83 | 99 | 5F | E8 | 46 | 42 | 88 | 1D | BF | 99 |

2      3

| BB | D0 | 39 | 6F | 9D | 01 | 31 | 90 | BB | D0 | 39 | 6F | 9D | 01 | 31 | 90 |
|----|----|----|----|----|----|----|----|----|----|----|----|----|----|----|----|
| 23 | 69 | CD | 3D | 6D | 5B | D5 | 59 | 23 | 69 | CD | 3D | 6D | 5B | D5 | 59 |
| 8C | DC | 0A | 70 | 59 | E5 | F8 | 6E | 8C | DC | 0A | 70 | 59 | E5 | F8 | 6E |
| 31 | A9 | 09 | 7B | 9D | 22 | 89 | DC | 31 | A9 | 09 | 7B | 9D | 22 | 89 | DC |
| D9 | A2 | 5B | C4 | FC | CA | 8B | 59 | D9 | A2 | 5B | C4 | FC | CA | 8B | 59 |
| 0C | 95 | 7C | 41 | CC | 06 | 83 | ED | 0C | 95 | 7C | 41 | CC | 06 | 83 | ED |
| 10 | DD | F0 | EC | 86 | 15 | C3 | 81 | 10 | DD | F0 | EC | 86 | 15 | C3 | 81 |
| 40 | 3A | EC | 0E | BB | BE | BF | 22 | 40 | 3A | EC | 0E | BB | BE | BF | 22 |
| 7E | 49 | C8 | 52 | 00 | 7C | 23 | F2 | 7E | 49 | C8 | 52 | 00 | 7C | 23 | F2 |
| 2F | 75 | 4D | 4F | 71 | 71 | 41 | 19 | 2F | 75 | 4D | 4F | 71 | 71 | 41 | 19 |
| 32 | FE | 1D | C1 | 22 | FD | 92 | 5D | 32 | FE | 1D | C1 | 22 | FD | 92 | 5D |
| 71 | B2 | FD | C3 | 5C | 99 | BB | 83 | 71 | B2 | FD | C3 | 5C | 99 | BB | 83 |
| 8C | 56 | 74 | 2D | 58 | C5 | 8B | 95 | 8C | 56 | 74 | 2D | 58 | C5 | 8B | 95 |
| 0E | B3 | 29 | 16 | 6F | DA | 01 | 36 | 0E | B3 | 29 | 16 | 6F | DA | 01 | 36 |
| 2D | E5 | CE | A3 | 54 | DE | 6C | 43 | 2D | E5 | CE | A3 | 54 | DE | 6C | 43 |
| 1D | 6C | 3A | B9 | 55 | 52 | 4C | B9 | 1D | 6C | 3A | B9 | 55 | 52 | 4C | B9 |

4

| C1 | 13 | 01 | B3 | BF | 6E | 2E | 9F |
|----|----|----|----|----|----|----|----|
| 95 | 53 | 7A | 8E | 1F | 58 | 43 | 36 |
| 88 | 43 | C5 | E4 | DD | B3 | 1A | 9E |
| 45 | 24 | 91 | 72 | 9D | 43 | 4E | 12 |
| A2 | 81 | 7F | 17 | A7 | 48 | 1E | BA |
| F0 | 04 | 2B | C9 | FA | 77 | D1 | 4A |
| 68 | 70 | D3 | 71 | 2B | 73 | 7D | 9F |
| 09 | CD | 45 | 5F | 95 | 4E | 3F | 3A |
| 57 | 95 | B7 | 75 | 3D | C8 | 42 | B7 |
| D4 | 2A | 77 | C2 | 6B | 95 | B0 | 05 |
| E8 | 53 | 2F | 85 | 0C | 88 | 38 | AD |
| 1A | 41 | A3 | 80 | 20 | EC | 20 | 94 |
| 07 | 56 | FC | B1 | 3D | EE | 46 | 89 |
| 5E | 14 | BD | 5B | 7A | 4F | 2C | B5 |
| DC | B5 | 85 | 91 | 49 | 72 | 1C | 5A |
| 5E | 45 | 65 | 92 | 77 | 2E | 28 | 9D |

FIG. 35

$$b_{\langle 2si-1\rangle_p} = b_{\langle 2(s-1)i-1\rangle_p} \oplus a_{\langle (2s-1)i-1\rangle_p} \oplus a_{\langle 2si-1\rangle_p} \qquad \text{Eq. 72}$$

$$S_{u,j_0}^{(V)} = \bigoplus_{i=0}^{m-1} a_{i,ut+j_0} \qquad \text{Eq. 73}$$

$$S_u^{(L)} = \bigoplus_{i=0}^{m-2}\bigoplus_{j=0}^{t-1} \alpha^{-i-j} a_{i,ut+j} \qquad \text{Eq. 74}$$

$$S_{i_0}^{(H)} = \bigoplus_{j=0}^{n-1} a_{i_0,j} \qquad \text{Eq. 75}$$

$$S_{i_1}^{(H)} = \bigoplus_{j=0}^{n-1} a_{i_1,j} \qquad \text{Eq. 76}$$

$$S_{u,j_1}^{(V)} = \bigoplus_{i=0}^{m-1} a_{i,ut+j_1} \qquad \text{Eq. 77}$$

$$S_u^{(L)} = \bigoplus_{i=0}^{m-2}\bigoplus_{j=0}^{t-1} \alpha^{-i-j} a_{i,ut+j} \qquad \text{Eq. 78}$$

$$\widetilde{H}_{m,n,\ell,w} = \left( \begin{array}{c} I_w \otimes \widetilde{H}_{m,n,\ell}^{(1)} \\ \hline (\overbrace{1 \; 1 \; 1 \; \ldots \; 1}^{w}) \otimes \left(I_m \otimes \begin{pmatrix} 1 & \alpha & \alpha^2 & \ldots & \alpha^{n-1} \end{pmatrix}\right) \end{array} \right), \qquad \text{Eq. 79}$$

FIG. 36

$$S_{i_0}^{(H),u} = \bigoplus_{j=0}^{n-1} a_{i_0,j}^{(u)} \qquad \text{Eq. 80}$$

$$S_{i_1}^{(H),u} = \bigoplus_{j=0}^{n-1} a_{i_1,j}^{(u)} \qquad \text{Eq. 81}$$

$$S_{st+j_1}^{(V),u} = \bigoplus_{i=0}^{m-1} a_{i,st+j_1}^{(u)} \qquad \text{Eq. 82}$$

$$S_{st+j_2}^{(V),u} = \bigoplus_{i=0}^{m-1} a_{i,st+j_2}^{(u)} \qquad \text{Eq. 83}$$

$$S_s^{(L),u} = \bigoplus_{i=0}^{m-1} \alpha^{-i} \bigoplus_{j=0}^{t-1} \alpha^{-j} a_{i,st+j}^{(u)} \qquad \text{Eq. 84}$$

$$\gamma_1 = \alpha^{-i_0-j_0} S_{i_0}^{(H),u} \oplus S_s^{(L),u} \qquad \text{Eq. 85}$$

$$\gamma_2 = \alpha^{j_0} S_{i_1}^{(H),u} \oplus \alpha^{-st} S_{i_1}^{(S)} \qquad \text{Eq. 86}$$

$$\gamma_3 = (\alpha^{-i_0-j_0} \oplus \alpha^{-i_0-j_1}) S_{st+j_1}^{(V),u} \oplus \gamma_1 \qquad \text{Eq. 87}$$

$$\gamma_4 = (\alpha^{-i_0-j_0} \oplus \alpha^{-i_0-j_2}) S_{st+j_2}^{(V),u} \oplus \gamma_3 \qquad \text{Eq. 88}$$

$$\gamma_5 = \frac{\alpha^{-(i_1-i_0)} S_{i_1}^{(H),u} \oplus \alpha^{i_0+j_0} \gamma_4}{(1 \oplus \alpha^{-(i_1-i_0)})(1 \oplus \alpha^{-(j_1-j_0)})} \qquad \text{Eq. 89}$$

$$\gamma_6 = \frac{\alpha^{-j_0} \gamma_2}{1 \oplus \alpha^{j_1-j_0}} \qquad \text{Eq. 90}$$

FIG. 37

$$a^{(u)}_{i_1, st+j_2} = \frac{(1 \oplus \alpha^{j_1-j_0})(\gamma_5 \oplus \gamma_6)}{(1 \oplus \alpha^{-(j_2-j_1)})(1 \oplus \alpha^{j_2-j_0})} \quad \text{Eq. 91}$$

$$a^{(u)}_{i_1, st+j_1} = \left( \frac{1 \oplus \alpha^{-(j_2-j_0)}}{1 \oplus \alpha^{-(j_1-j_0)}} \right) a^{(u)}_{i_1, st+j_2} \oplus \gamma_5 \quad \text{Eq. 92}$$

$$a^{(u)}_{i_1, st+j_0} = a^{(u)}_{i_1, st+j_1} \oplus a^{(u)}_{i_1, st+j_2} \oplus S^{(H),u}_{i_1} \quad \text{Eq. 93}$$

$$a^{(u)}_{i_0, st+j_2} = a^{(u)}_{i_1, st+j_2} \oplus S^{(V),u}_{st+j_2} \quad \text{Eq. 94}$$

$$a^{(u)}_{i_0, st+j_1} = a^{(u)}_{i_1, st+j_1} \oplus S^{(V),u}_{st+j_1} \quad \text{Eq. 95}$$

$$a^{(u)}_{i_0, st+j_0} = a^{(u)}_{i_0, st+j_1} \oplus a^{(u)}_{i_0, st+j_2} \oplus S^{(H),u}_{i_0} \quad \text{Eq. 96}$$

Converting Data for a Storage System Into a Plurality of $w$ Storage Device Arrays, Each Storage Device Array Including $n$ Storage Devices, Each Storage Device Divided Into $m$ Sector or Pages — 3910

Grouping the $n$ Storage Devices Into $\ell$ Groups of $t$ Storage Devices Each — 3920

Correcting Erasures in the Plurality of $w$ Storage Device Arrays Based on:
Protecting Each Row and Column in Each $m \times n$ Array by an Erasure-Correcting Code, Wherein Each Group of $t$ Storage Devices Contains Extra Parties to Correct Extra Erasures in Addition to Erasures Corrected by Vertical Parties in Each $m \times t$ Subarray, and $w, n, m, \ell$ and $t$ are Positive Intergers — 3930

FIG. 39

HIERARCHICAL PROCESSING FOR EXTENDED PRODUCT CODES

BACKGROUND

Considerable interest has arisen lately in coding schemes that combine local and global properties. Applications like Redundant Arrays of Independent Disks (RAID) architectures are an example of this interest. In effect, given an array of storage devices, a regular RAID architecture such as RAID 5, protects against a total storage device failure. The storage devices may be, for example, solid state devices (SSDs), hard disk drives (HDDs), tapes, or other types of storage devices. The RAID 5 architecture is implemented by XORing the contents of the data storage devices, where the outcome of XORing is stored in a parity storage device. Then, if a storage device fails, its contents can be recovered by XORing the contents of the surviving storage devices. However, RAID 5 may be insufficient for large numbers of storage devices.

Other approaches involve using a limited amount of parities, such as one or two extra parities, called global parities. So, if there is an m×n array of storage devices, each row is protected by a parity like in RAID 5. A column of storage devices may represent a box or some other configuration, but it is assumed that a column may fail, in which case each element in the column is recovered row by row (locally), like in RAID 5. But if some extra storage devices have failed in addition to the column, data loss will occur if no extra precautions are taken.

SUMMARY

Embodiments of the invention relate to storage device arrays that may represent a data center with global parities spanning all of the devices in the data centers, where recovery of more than one device failure is provided by hierarchical processing. In one embodiment, a method for hierarchical correction coding includes converting data for a storage system into a plurality of w storage device arrays, each storage device array including n storage devices, and each storage device divided into m sectors or pages. The n storage devices are grouped into l groups of t storage devices each. Erasures in the plurality of w storage device arrays are corrected based on protecting each row and column in each m×n array by an erasure-correcting code. Each group of t storage devices contains extra parities to correct extra erasures in addition to erasures corrected by vertical parities in each m×t subarray, and w, n, m, l and t are positive integers.

These and other features, aspects and advantages of the present invention will become understood with reference to the following description, appended claims and accompanying figures.

BRIEF DESCRIPTION OF THE DRAWINGS

FIG. 6 shows example matrices $H_0$, $H_1$ and $H_2$, according to an embodiment;

FIG. 10 shows Eq. 2, according to an embodiment;

FIG. 11 shows an example matrix $\tilde{H}_2$ used with $H_0$ and $H_1$ of FIG. 6, according to an embodiment;

FIG. 12 shows Eqs. 3 and 4, according to an embodiment;

FIG. 13 shows Eqs. 5-8, according to an embodiment;

FIG. 14 shows an example 15×8 array showing data symbols, horizontal and vertical parities corresponding to two groups of four consecutive columns, according to an embodiment;

FIG. 15 shows Eq. 9, according to an embodiment;

FIG. 16 shows example parity check matrix that equals matrices $H_0$, $H_1$ and $H_2$, according to an embodiment;

FIG. 17 shows an example of six erasures in a same group using 4×8 arrays, according to an embodiment;

FIG. 18 shows Eq. 10, according to an embodiment;

FIG. 19 shows an example matrix $H_2$ used with $H_0$ and $H_1$ of FIG. 16, according to an embodiment;

FIG. 21 shows Eq. 11, according to an embodiment;

FIG. 23 shows a table of binary to hexadecimal correspondence;

FIG. 25 shows a table of logarithms from 127 to 254 with values in hex, according to an embodiment;

FIG. 26 shows Eq. 12, according to an embodiment;

FIG. 27 shows Eqs. 13-22, according to an embodiment;

FIG. 28 shows Eqs. 23-34, according to an embodiment;

FIG. 29 shows Eqs. 35-46, according to an embodiment;

FIG. 30 shows an example array including five arrays of 16×8 to be encoded, according to an embodiment;

FIG. 31 shows the example array of FIG. 30 encoded, according to an embodiment;

FIG. 32 shows Eqs. 47-57, according to an embodiment;

FIG. 33 shows Eqs. 58-71, according to an embodiment;

FIG. 34 shows an example array including five arrays of 16×8 to be decoded, according to an embodiment;

FIG. 35 shows the example array of FIG. 34 decoded, according to an embodiment;

FIG. 36 shows Eqs. 72-79, according to an embodiment;

FIG. 37 shows Eqs. 80-90, according to an embodiment;

FIG. 38 shows Eqs. 91-96, according to an embodiment;

FIG. 39 is a block diagram for a process for data recovery, according to an embodiment.

DETAILED DESCRIPTION

Figure 1:
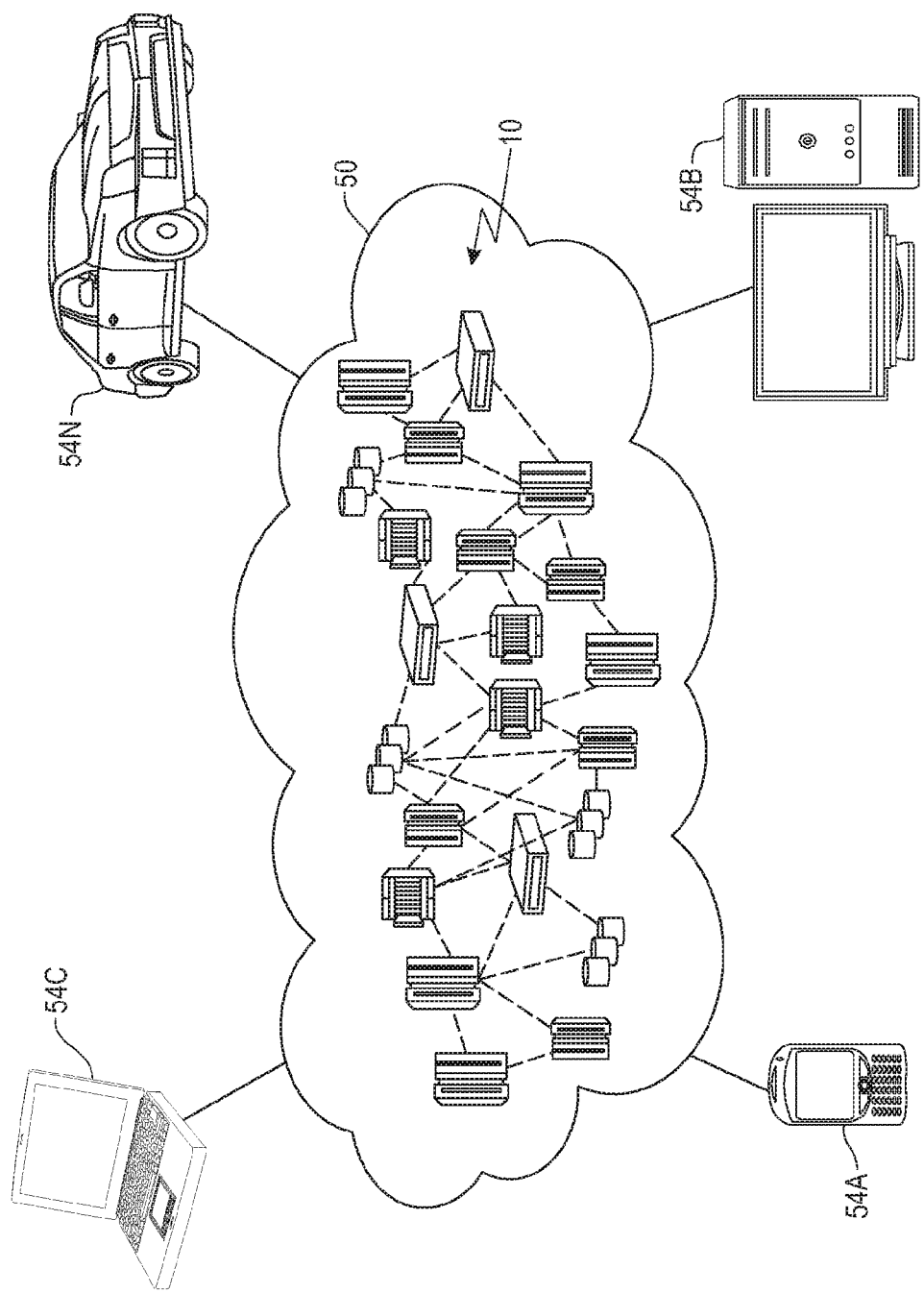
FIG. 1 depicts a cloud computing environment, according to an embodiment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is understood in advance that although this disclosure includes a detailed description of cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines (VMs), and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed and automatically, without requiring human interaction with the service's provider.

Broad network access: capabilities are available over a network and accessed through standard mechanisms that promote use by heterogeneous, thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or data center).

Rapid elasticity: capabilities can be rapidly and elastically provisioned and, in some cases, automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active consumer accounts). Resource usage can be monitored, controlled, and reported, thereby providing transparency for both the provider and consumer of the utilized service.

Service Models are as follows:

Software as a Service (SaaS): the capability provided to the consumer is the ability to use the provider's applications running on a cloud infrastructure. The applications are accessible from various client devices through a thin client interface, such as a web browser (e.g., web-based email). The consumer does not manage or control the underlying cloud infrastructure including network, servers, operating systems, storage, or even individual application capabilities, with the possible exception of limited consumer-specific application configuration settings.

Platform as a Service (PaaS): the capability provided to the consumer is the ability to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application-hosting environment configurations.

Infrastructure as a Service (IaaS): the capability provided to the consumer is the ability to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is a service oriented with a focus on statelessness, low coupling, modularity, and semantic interoperability. At the heart of cloud computing is an infrastructure comprising a network of interconnected nodes.

Referring now to FIG. 1, an illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as private, community, public, or hybrid clouds as described hereinabove, or a combination thereof. This allows the cloud computing environment 50 to offer infrastructure, platforms, and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 2:
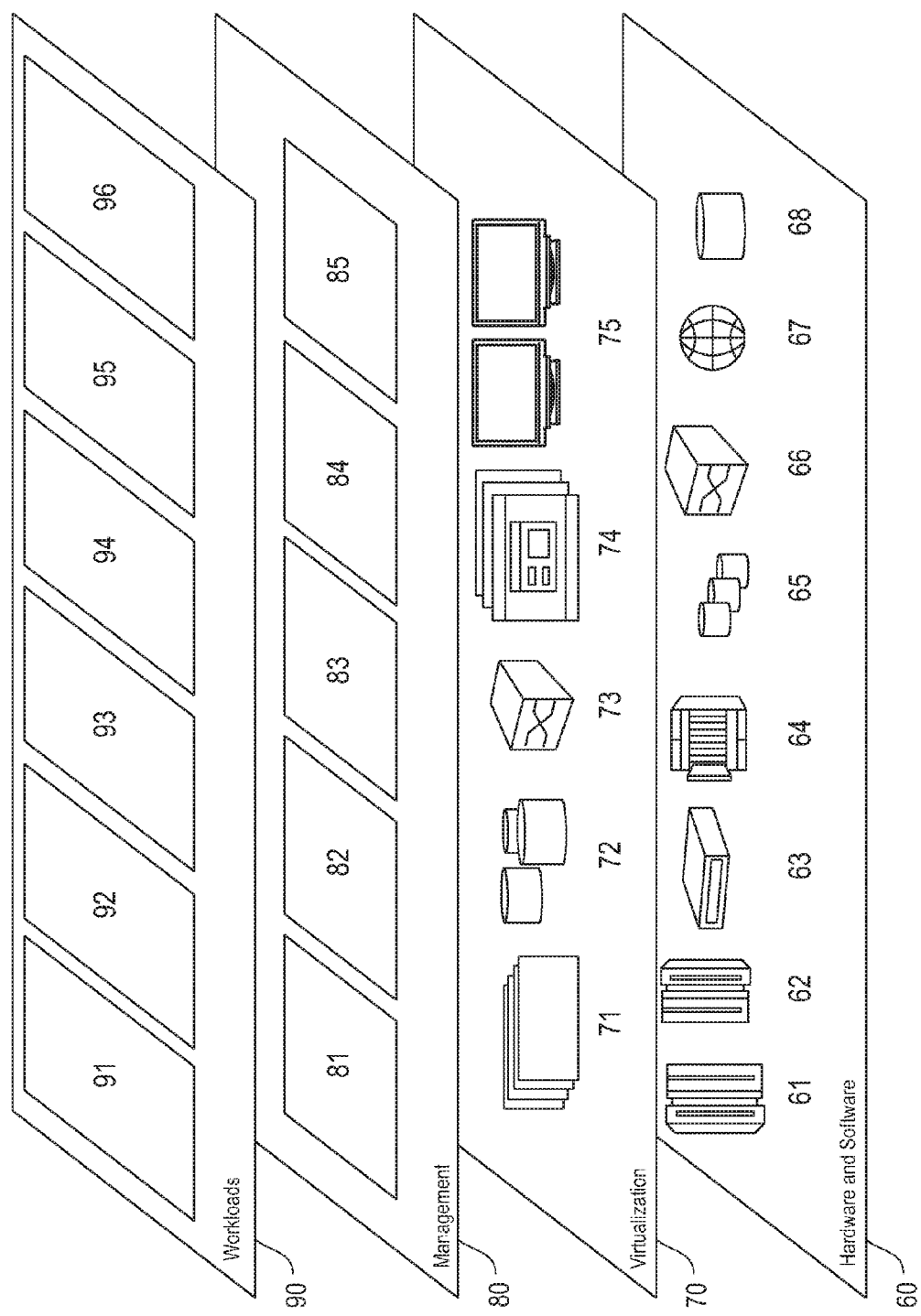
FIG. 2 depicts a set of abstraction model layers, according to an embodiment.

Referring now to FIG. 2, a set of functional abstraction layers provided by the cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, a management layer 80 may provide the functions described below. Resource provisioning 81 provides dynamic procurement of computing resources and other resources that are utilized to perform tasks within the cloud computing environment. Metering and pricing 82 provide cost tracking as resources are utilized within the cloud computing environment and billing or invoicing for consumption of these resources. In one example, these resources may comprise application software licenses. Security provides identity verification for cloud consumers and tasks as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95, and hierarchical erasure correction processing 96. As mentioned above, all of the foregoing examples described with respect to FIG. 2 are illustrative only, and the invention is not limited to these examples.

It is understood all functions of one or more embodiments as described herein may be typically performed by the cloud computing environment 50, system 300 (FIG. 3), system 4000 (FIG. 40), which can be tangibly embodied as hardware processors and with modules of program code. However, this need not be the case. Rather, the functionality recited herein could be carried out/implemented and/or enabled by any of the layers 60, 70, 80 and 90 shown in FIG. 2.

It is reiterated that although this disclosure includes a detailed description on cloud computing, implementation of the teachings recited herein are not limited to a cloud computing environment. Rather, the embodiments of the present invention may be implemented with any type of clustered computing environment now known or later developed.

Flash devices are a type of non-volatile storage devices that can be electrically erased and reprogrammed in large blocks. Like hard disk drives (HDDs), flash devices divide the medium into sectors that are typically 512 bytes long. Flash devices further collect sectors into pages with typically eight sectors per page, so that each page contains four thousand or 4 kilo (K) bytes. Each sector is protected by an error correcting code (ECC) that corrects a number of single bit errors. A popular choice, for example, is a Bose-Chaudhuri-Hocquenghem (BCH) code, like an eight bit correcting or fifteen bit correcting BCH code, although many variations are possible. BCH codes do hard decision decoding. Low Density Parity Check (LDPC) codes are another example of a popular choice, and in this case soft decision is used. As in HDDs, pages in flash devices may suffer hard errors (HEs). This occurs, for example, when the error correcting capability of the BCH or the LDPC code is exceeded. As compared to HDDs, exceeding the capability of the error-correcting code is more likely in flash devices, both as a page nears the end of its write endurance lifetime, or as a page nears the end of its data retention lifetime. Thus, the number of HEs in flash devices may be expected to grow over time, leaving latent HEs on a device. An array made up of flash devices may encounter a mix of catastrophic device failures combined with possibly more prevalent HEs.

Addition of first responder parities to data that is stored in a storage array reduces the number of storage devices that need to be accessed in order to recover from a single sector erasure in a stripe, as opposed to requiring access to all of the storage devices in the stripe, as is done in a RAID 5 architecture. Reducing the number of devices that are accessed in the event of a failure may increase the performance of the storage array. Further, global parities that are used in conjunction with row and column parities may also increase the minimum distance of the erasure correcting codes to 6, or to 7 or 8 in further embodiments. The minimum distance of the code is a parameter that measures the correcting-capability of the code. If the minimum distance of an erasure correcting code is d, the code can recover up to d−1 erasures, no matter where those erasures are located (for example, multiple erasures in the same row or column) in the storage array.

The data in the storage array is stored as stripes, in two-dimensional (2-D) storage arrays each stripe comprises an M by N array of symbols, i.e., M rows and N columns. The columns may each correspond to respective individual storage devices of the storage array, which may be flash solid state devices (SSDs). Flash SSDs provide relatively fast memory; however, over time, SSD memory may degrade as many reads and writes are performed, leading to errors in which one or more symbols in a stripe are lost. Each symbol may be a fixed-size sector, or page, comprising a fixed number of bytes of data. At least one of the columns (or devices) in a stripe is a row parity column, comprising a column of symbols that each give parity information for the specific row in the stripe in which the symbol is located. If a whole device fails, the data that was stored on the device is recovered by XORing the data stored in the surviving devices of the storage array. However, additional, isolated pages in other devices may also fail, resulting in data loss. Adding global parity symbols may prevent the data loss. However, all of the storage devices may need to be accessed in order to reconstruct the failed page. If page erasures are common, accessing all of the storage devices has a negative impact on overall system performance.

The use of product codes, in which both horizontal and vertical parities are used, allows for the development of multiple responder approaches. If there is an array in which each column represents a storage device (e.g., flash), and each symbol represents a sector or page in the storage device, a vertical code retrieves a failed sector or page in which its internal ECC has been exceeded. The first responder takes care of sector failures only using the vertical parity. That is, a sector failure is corrected within the device, and the remaining devices are not invoked. An extra parity may cover a subset of the devices allowing for correction of more than one sector within the subset. The horizontal parities allow for correction of even more sectors as well as whole device failures. The idea is to skillfully combine the parities in such a way that the correcting capability of the code is optimized.

In one embodiment, arrays of devices represent a data center, and further global parities spanning all the devices in all the data centers are added. In one example, the recovery from more than one device failure in a data center, provided that the remaining data centers do not experience more than one device failure, may be provided. In one embodiment, this recovery is referred to as a hierarchical approach that optimizes the redundancy. The encoding takes into account the sequential mounting of devices and syndromes are kept in buffer in order to effect the final encoding.

Figure 3:
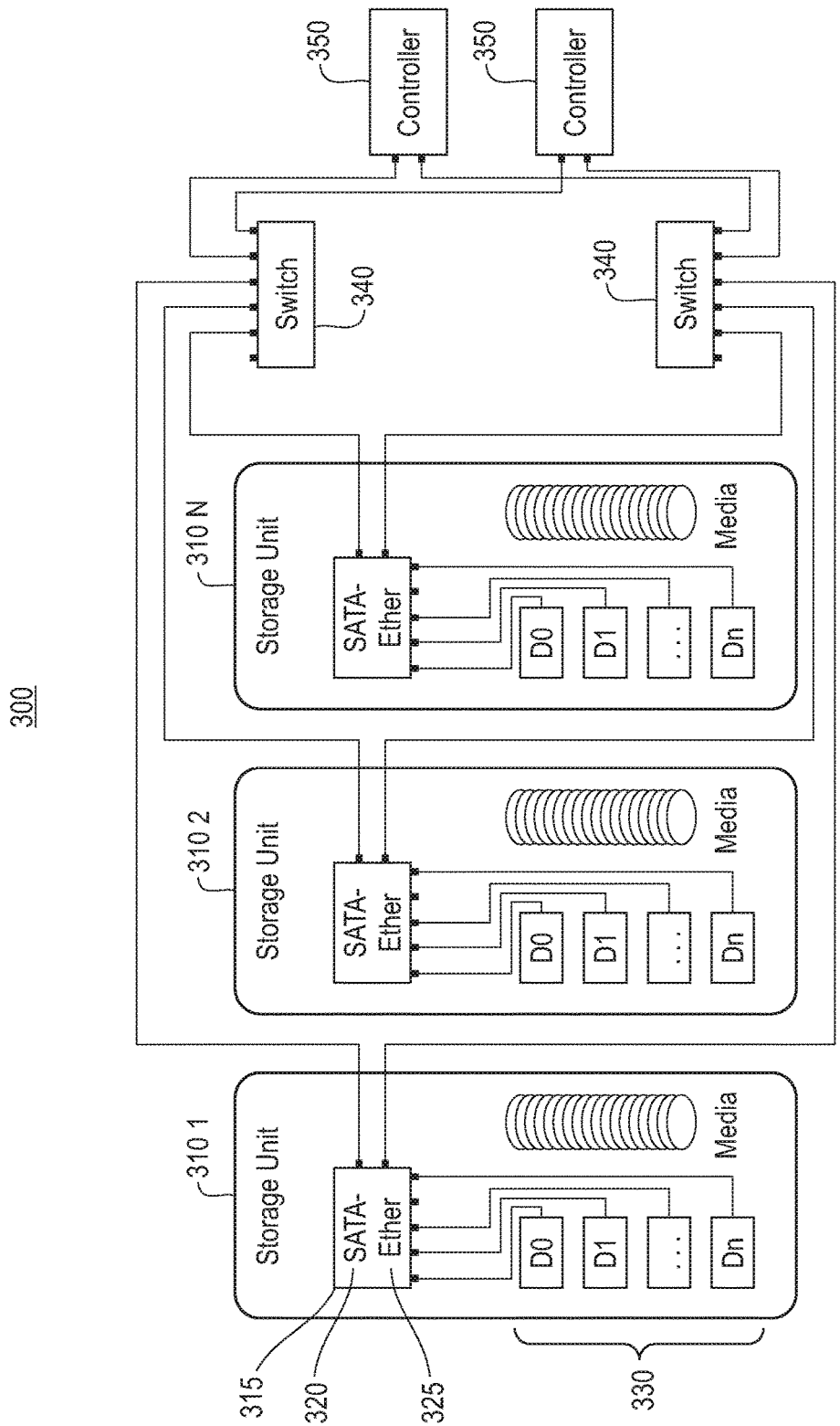
FIG. 3 illustrates a block diagram of a system implemented with hierarchical data recovery processing, according to one embodiment.

FIG. 3 illustrates a block diagram of a system 300 implemented with hierarchical data recovery processing, according to one embodiment. In one embodiment, system 300 is implemented in a data center or a cloud environment data center. In one embodiment, system 300 includes multiple storage units 310 1, 310 2 to 310 N, switches 340, and global system controllers 350 (e.g., storage device controllers). In one example, the storage units are optical storage units/devices. In one example, the set of storage units (310 1-N) are connected over a network by the pair of switches 340 to the pair of global system controllers 350. Each storage unit 310 includes a set of drives 330, media and a local controller 315 (including a SATA 320 port and an Ethernet 325 port) for communicating with the network and controlling the drives 330 and mounting media. The drives 330 are labeled $D_0, D_1, \ldots D_n$ in each storage unit 310 1-N. The drives 330 may be attached to the local controller 315 via a SATA interface, and the storage units 310 1-N connect to an Ethernet network using, for example, iSCSI. Providing the storage units 310 1-N with dual ports 320/325 ensures network connectivity even if a switch 340 or a global system controller 350 is lost. The system 300 should be protected against media non-recoverable read errors (NRRE), media loss, and storage unit loss. The system should recover from each type of loss using the least amount of resources required, such as network bandwidth. Further, more frequent errors should require less recovery resource than less frequent errors. The following description provides hierarchical error coding and erasure recovery.

One or more embodiments provides for efficient distributed encoding and decoding. In one example, in the configuration of system 300, the encoding and decoding can take place in the global system controllers 350, or it may be split between the global system controllers 350 and the local controllers 315. Assume the data is to be encoded according to FIG. 20. In one example, there are n=8 storage units 310, each with a set of drives and at least with w=5 pieces of media. In general, there will be many more than w pieces of media in a storage unit 310, belonging to many such encodings. The code blocks use m=15 sectors on each disk. One embodiment distributes the load to have the horizontal (H), local (L) and shared (S) parities computed by the global system controllers 350, and the V parities computed in the storage unit local controllers 315. This is possible since the V parities can be computed from only the symbols in the corresponding column. This is true for the H and S columns as well, since all the parities in the bottom row of each array in FIG. 20 may also be computed as V parities. The V parity is then written following the data symbols in the column. In one embodiment, it is preferable to write the symbols of a column in FIG. 20 sequentially to a single piece of media. This approach improves the system scaling, as the V parity workload is off-loaded to each storage unit 310. Note that the H parities have a similar property, in that they are encoded using symbols in the same row. The distributed property can also be used for data recovery. In the above embodiment, if during a read operation, there is a single symbol loss on a piece of media, then this missing symbol can be recovered from the same media by reading the remaining symbols in the column and recovering it using the vertical parity. Thus no resources outside of the current storage unit or the media in the drive are required for this class of loss. It is only in the situation where there is more than one symbol lost per column that external resources are needed.

Figures 4, 5:
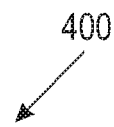
FIG. 4 illustrates an example 15×8 array including representative data symbols, according to one embodiment.
FIG. 5 shows Eq. 1, according to an embodiment.

In one example, consider a product code such that each row and each column are encoded with single even parity. The code includes m×n arrays. In addition, we divide the columns into t sets consisting of t consecutive columns each, n=lt. Each set contains an extra parity symbol. In one embodiment, the extra parity provides the following. When there are two erasures in a set of t consecutive columns, such erasures are corrected invoking only the vertical parities and the parity corresponding to the set. This is what is referred to as a second responder approach; a first responder would correspond to the vertical parities. If it is assumed that each column corresponds to a device, or to a just a bunch of disks (JBOD), an erasure is corrected by invoking only the device or JBOD where the erasure has occurred, and not the whole array. For two erasures, the second responder corrects the erasures by invoking at most a set of t consecutive devices or JBODs. A second purpose of introducing the second responder parities is to increase the minimum distance of the code. The product code has minimum distance 4, i.e., any 3 erasures will be corrected. As will be described, the second responder parities will increase this minimum distance to 6, i.e., any 5 erasures will be corrected. FIG. 4 illustrates a view 400 for a 15×8 array with the data (D), the horizontal parities (H), the vertical parities (V) and the l=2 second responder parities (L) corresponding to two sets of four t=4 consecutive columns each.

In one embodiment, the code is defined by giving an (m+n+)×mn parity-check matrix over the field $GF(2^b)$, where $\max\{m, t+1\} \leq 2^b$. Herein, the h×h identity matrix is denoted by $I_h$, and the Kronecker product is denoted as $\oplus$. Let $C_{m,n,l}^{(1)}$ be the [mn, mn−m−n−l+1] code whose parity-check matrix is represented by Eq. 1 as shown in FIG. 5. The rows of $H_{m,n,l}^{(1)}$ are not linearly independent, and one could eliminate one of the first m+n rows. However, its form is convenient and simple. The construction is illustrated with the example below.

Figure 7:
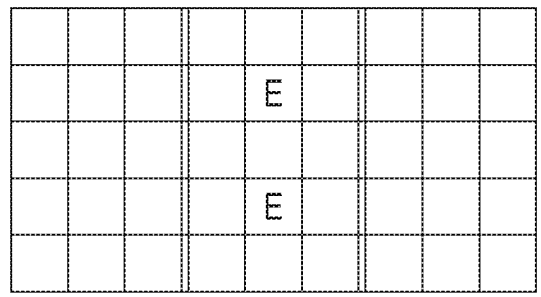
FIG. 7 shows an example 5×9 array for recovery of erasures using vertical parity, according to an embodiment.

In one example, consider the finite field GF(8). Take 3×8 arrays, l=2 and let α be a primitive element in GF(8). Then, according to Eq. 1, the 13×24 parity-check matrix of code $C_{3,8,2}^{(1)}$ is given by $H_{3,8,2}^{(1)}=(H_0 \ H_1 \ H_2)$, where $H_0$, $H_1$ and $H_2$ are illustrated in view 600 in FIG. 6. The following lemma proves that if there are two erasures in a set of t consecutive columns, such erasures are corrected using only the vertical parity V and the parity L corresponding to such set. Consider an m×n array $(a_{i,j})_{0 \leq i \leq m-1, 0 \leq j \leq n-1}$ that is a codeword of code $C_{m,n,l}^{(1)}$ defined by the parity-check matrix $H_{m,n,l}^{(1)}$ as given by Eq. 1. Assume that locations $(i_0, r)$ and $(i_1, r)$, where $0 \leq i_0 < i_1 \leq m-1$ and $st \leq r \leq (s+1)t-1$ for some $0 \le s \le l-1$ have been erased. Then, such locations can be retrieved by invoking only the vertical parity corresponding to column r and the parity corresponding to columns st, st+1, ..., (s+1)t-1. FIG. 7 shows an example 700 of a 5×9 array for recovery of erasures using vertical parity, according to an embodiment.

Figure 8:
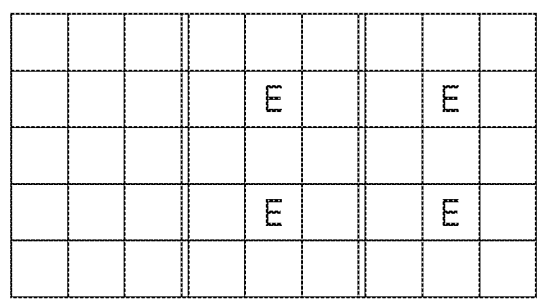
FIG. 8 shows an example of four erasures in two different sets of consecutive columns, according to an embodiment.
Figure 9:
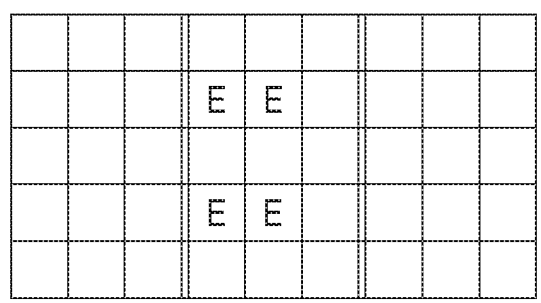
FIG. 9 shows an example of four erasures in a same set of consecutive columns, according to an embodiment.

The following description gives the minimum distance of code $C_{m,n,l}^{(1)}$. The code $C_{m,n,l}^{(1)}$ consisting of m×n arrays over $GF(2^b)$ whose parity-check matrix is given by Eq. 1 has minimum distance 6, where $\max\{m, t+1\} \le 2^b$ and n=lt. FIG. 8 shows an example 800 of four erasures in two different sets of consecutive columns, according to an embodiment (i.e., 4 erasures in two different sets of t=3 consecutive columns for 5×9 arrays). Assume that there are 4 erasures in the same set of t consecutive columns. Specifically, assume that such erasures are in locations $(i_0, st+j_0)$, $(i_0, t+j_1)$, $(i_1, st+j_0)$ and $(i_1, st+j_1)$, where $0 \le i_0 \le i_1 \le m-1$, $0 \le j_0 \le j_1 \le t-1$ and $0 \le s \le l-1$, as illustrated in FIG. 9 showing an example 900 of four erasures in a same set of consecutive columns (i.e., 4 erasures in the same set of t=3 consecutive columns for 5×9 arrays). Assume first that $i_1 \le m-2$. Then, using Eq. 1, it is enough to prove that the 4×4 matrix $$\begin{pmatrix} 1 & 1 & 0 & 0 \\ 0 & 0 & 1 & 1 \\ 0 & 1 & 0 & 1 \\ \alpha^{-i_0-j_0} & \alpha^{-i_0-j_1} & \alpha^{-i_1-j_0} & \alpha^{-i_1-j_1} \end{pmatrix}$$

is invertible. Redefining $i \leftarrow i_1-i_0$ and $j \leftarrow j_1-j_0$, where now $1 \le i \le m-2$ and $1 \le j \le t-1$, this matrix is invertible if and only if matrix $$\begin{pmatrix} 1 & 1 & 0 & 0 \\ 0 & 0 & 1 & 1 \\ 0 & 1 & 0 & 1 \\ 1 & \alpha^{-j} & \alpha^{-i} & \alpha^{-i-j} \end{pmatrix}$$

is invertible, if and only if the 3×3 matrix $$\begin{pmatrix} 1 & 0 & 1 \\ 0 & 1 & 1 \\ 1 \oplus \alpha^{-j} & \alpha^{-i} & \alpha^{-i-j} \end{pmatrix}$$

is invertible, if and only if the 2×2 matrix $$\begin{pmatrix} 1 & 1 \\ \alpha^{-i} & 1 \oplus \alpha^{-j} \oplus \alpha^{-i-j} \end{pmatrix}$$

is invertible, if and only if $1 \oplus \alpha^{-i} \oplus \alpha^{-j} \oplus \alpha^{-i-j} = (1 \oplus \alpha^{-i})(1 \oplus \alpha^{-j})$ is invertible, which is the case since $1 \le j \le t-1 < 2^b-1$ and $1 \le i \le m-2 < 2^b-1$.

In one example, assume next that $i_1 = m-1$. Then, using Eq. 1, it is enough to prove that the 4×4 matrix $$\begin{pmatrix} 1 & 1 & 0 & 0 \\ 0 & 0 & 1 & 1 \\ 0 & 1 & 0 & 1 \\ \alpha^{-i_0-j_0} & \alpha^{-i_0-j_1} & 0 & 0 \end{pmatrix}$$

is invertible. Redefining $j \leftarrow j_1-j_0$, where now $1 \le j \le t-1$, this matrix is invertible if and only if matrix $$\begin{pmatrix} 1 & 1 & 0 & 0 \\ 0 & 0 & 1 & 1 \\ 0 & 1 & 0 & 1 \\ 1 & \alpha^{-j} & 0 & 0 \end{pmatrix}$$

is invertible, if and only if the 3×3 matrix $$\begin{pmatrix} 1 & 0 & 1 \\ 0 & 1 & 1 \\ 1 \oplus \alpha^{-j} & 0 & 0 \end{pmatrix}$$

is invertible, if and only if the 2×2 matrix $$\begin{pmatrix} 1 & 1 \\ 0 & 1 \oplus \alpha^{-j} \end{pmatrix}$$

is invertible, which it certainly is, since $1 \le j \le t-1 < 2^b-1$.

In one embodiment, a modification of code $C_{m,n,l}^{(1)}$ may also be used. The code $\hat{C}_{m,n,l}^{(1)}$ is defined by giving an (m+n+l)×mn parity-check matrix over the field $GF(2^b)$, where now $\max\{m, t\} \le 2^b-1$. Explicitly, the parity-check matrix of the [mn, mn-m-n-l+1] code is given by Eq. 2 shown in FIG. 10. Matrices $H_{m,n,l}^{(1)}$ and $\hat{H}_{m,n,l}^{(1)}$ are very similar, and $\tilde{H}_{m,n,l}^{(1)}$ has a more symmetric form. However, in some cases the use of code $C_{m,n,l}^{(1)}$ is preferred since it may require a smaller field. The issue is related to the extension of Reed-Solomon codes. For example, assume that m=256, n=12 and l=3. Code $C_{256,12,3}^{(1)}$ requires a field of size $2^b$ satisfying $\max\{m,t+1\}=256 \le 2^b$, while code $\hat{C}_{256,12,3}^{(1)}$ requires a field of size $2^b$ satisfying $\max\{m,t\}=256 \le 2^b-1$. Thus, $C_{256,12,3}^{(1)}$ can be constructed using the field GF(256), but a larger field must be used, such as GF(512), to construct $\hat{C}_{256,12,3}^{(1)}$. Consider the following example to illustrate the construction of $\hat{C}_{3,8,2}^{(1)}$. In this example, consider the finite field GF(8) and, as in the example provided above, take 3×8 arrays, l=2 and let $\alpha$ be a primitive element in GF(8). Then, according to Eq. 2, the 13×24 parity-check matrix of code $\hat{C}_{256,12,3}^{(1)}$ is given by $\tilde{H}_{3,8,2}^{(1)} = (H_0 \ H_1 \ \tilde{H}_2)$, where $H_0$ and $H_1$ are given in the example described above, and example matrix $\tilde{H}_2$ 1100 used with $H_0$ and $H_1$ of FIG. 6 is shown in FIG. 11.

In one embodiment, a theorem similar to that described above for $C_{m,n,l}^{(1)}$ holds. The code $\hat{C}_{m,n,l}^{(1)}$ including m×n arrays over $GF(2^b)$, whose parity-check matrix is given by Eq. 2 has minimum distance 6, where $\max\{m,t\} \le 2^b-1$ and n=lt. In one embodiment, the following is a decoding process for $C_{m,n,l}^{(1)}$. Consider code $C_{m,n,l}^{(1)}$. Assume that an m×n array, n=lt, $(a_{i,j})_{0 \le i \le m-1, 0 \le j \le n-1}$ is received, possibly containing erasures. In one example, the decoding process proceeds as follows:

START: Make u←0 and j←0.

First Responder: If entry $a_{i_0, ut+j}$ has been erased and there are no other erasures in column j, make $$a_{i_0, ut+j} = \bigoplus_{\substack{i=0 \\ i \ne i_0}}^{m-1} a_{i, ut+j}$$

Make j←j+1. If j<t go to First Responder.

Second Responder: If there are either no erasures or more than two erasures in columns ut+j, 0≤j≤t−1, then go to Third Responder. If there are exactly two erasures in entries $a_{i_0, ut+j_0}$ and $a_{i_1, ut+j_0}$, where $0 \le i_0 < i_1 \le n-1$ and $0 \le j_0 \le t-1$, and the remaining entries $a_{i, ut+j}$ are erasure free, then, assuming $a_{i_0, ut+j_0} = 0$ and $a_{i_1, ut+j_0} = 0$, compute the syndromes represented by Eqs. 3 and 4 shown in FIG. 12.

If $i_1 < m-1$, then make $$a_{i_1, ut+j_0} = \frac{\alpha^{i_1-i_0} S_{u,j_0}^{(V)} \oplus \alpha^{i_1+j_0} S_u^{(L)}}{1 \oplus \alpha^{i_1-i_0}}$$

$$a_{i_0, ut+j_0} = a_{i_1, ut+j_0} \oplus S_{u,j_0}^{(V)},$$

while if $i_1 = m-1$, make $$a_{i_0, ut+j_0} = \alpha^{i_0+j_0} S_u^{(L)}$$

$$a_{i_1, ut+j_0} = a_{i_0, ut+j_0} \oplus S_{u, j_0}^{(V)}.$$

Third Responder: Make u←u+1. If u<l then make j←0 and go to First Responder. Otherwise, if u=l and there are no more erasures, then output $(a_{i,j})_{0 \le j \le n-1, 0 \le j \le n-1}$ and go to EXIT. If there are no rows with exactly one erasure, then go to Fourth Responder. If there are rows with exactly one erasure, then, for each row $i_s$ with exactly one erasure in location $a_{i_s, j_s}$, where $0 \le i_s \le m-1$ and $0 \le j_s \le n-1$ make $$a_{i_s, j_s} = \bigoplus_{\substack{j=0 \\ j \ne j_s}}^{n-1} a_{i_s, j}$$

If there are no more erasures, then output $(a_{i,j})_{0 \le i \le m-1, 0 \le j \le n-1}$ and go to EXIT, otherwise, go to START.

Fourth Responder: If the number of erasures is greater than 4, then declare an uncorrectable error and go to EXIT. Otherwise, assume that the erasures occurred in locations $a_{i_0, ut+j_0}$, $a_{i_0, ut+j_1}$, $a_{i_1, ut+j_0}$, and $a_{i_1, ut+j_1}$, where $0 \le i_0 \le i_1 \le m-1$, $0 \le u \le s-1$ and $0 \le j_0 < j_1 \le t-1$. Making these locations equal to zero, compute the syndromes represented as Eqs. 5-8 shown in FIG. 13.

If $i_1 < m-1$, make $$a_{i_1, ut+j_1} = \frac{(\alpha^{-(i_1-i_0)} S_{i_1}^{(H)} \oplus (1 \oplus \alpha^{-(j_1-j_0)}) S_{u,j_1}^{(V)} \oplus S_{i_0}^{(H)} \oplus \alpha^{i_0+j_0} S_u^{(L)})}{(1 \oplus \alpha^{-(i_1-i_0)})(1 \oplus \alpha^{-(j_1-j_0)})}$$

$$a_{i_1, ut+j_0} = a_{i_1, ut+j_1} \oplus S_{i_1}^{(H)},$$

$$a_{i_0, ut+j_1} = a_{i_1, ut+j_1} \oplus S_{u, j_1}^{(V)}$$

$$a_{i_0, ut+j_0} = a_{i_0, ut+j_1} \oplus S_{i_0}^{(H)},$$

and go to EXIT, while, if $i_1 = m-1$, make $$a_{i_0, ut+j_1} = \frac{S_{i_0}^{(H)} \oplus \alpha^{i_0+j_0} S_u^{(L)}}{1 \oplus \alpha^{-(j_1-j_0)}}$$

$$a_{i_0, ut+j_0} = a_{i_0, ut+j_1} \oplus S_{i_0}^{(H)}$$

$$a_{i_1, ut+j_1} = a_{i_0, ut+j_1} \oplus S_{u, j_1}^{(V)}$$

$$a_{i_1, ut+j_0} = a_{i_1, ut+j_1} \oplus S_{i_1}^{(H)}.$$

EXIT:

In one embodiment, a product code with vertical parity, two horizontal parities and extra parity in groups of columns is described below. FIG. 14 shows an example 1400 of a 15×8 array showing data symbols, horizontal and vertical parities corresponding to two groups of four consecutive columns, according to an embodiment. In one example, consider a code consisting of m×n arrays with n=lt such that:

1. Each row corresponds to an [n,n−2,3] MDS code (similar to RAID 6, i.e., each row can correct up to two erasures).

2. Each column corresponds to an [n, n−1,2] code (i.e., each column can correct one erasure).

3. Dividing the columns into f sets of t consecutive columns, each set has an extra parity.

Such a code, when the entries are considered row-wise, is an [mn, mn−(2m+n+l−2)] code. The code is illustrated in FIG. 14 for m=15, n=8 and l=2, giving a [120,82] code. In one embodiment, a code is constructed for maximizing the minimum distance. Described below is a construction giving a minimum distance equal to 8.

As stated, the code consists of m×n arrays. Let $GF(2^b)$ be a finite field such that $\max\{m, t+1\} \le 2^b$ and n=lt. Let α be a primitive element in $GF(2^b)$. Let $C_{m,n,l}^{(2)}$ be the [mn, mn−2m−n−l+2] code whose parity-check matrix is the (m+2n+L)×mn matrix represented in Eq. 9 shown in FIG. 15. The first 2m+n rows of $H_{m,n,l}^{(2)}$ are linearly dependent. In fact, two of the rows can be deleted to make the matrix linearly independent, but as described above, it is convenient to keep the definition given by Eq. 9. The construction is illustrated with an example described below.

In one example, consider the finite field GF(8). Take 3×8 arrays and let α be a primitive element in GF(16). Then, according to Eq. 9, the 16×24 parity-check matrix is given by $$H_{3,8,2}^{(2)} = (H_0 \; H_1 \; H_2)$$

where $H_0$, $H_1$ and $H_2$ are shown in view 1600 in FIG. 16. The following theorem gives the minimum distance of code $C_{m,n,l}^{(2)}$. The code $C_{m,n,l}^{(2)}$ whose parity-check matrix is given by Eq. 9, consisting of m×n arrays over $GF(2^b)$, where n=Lt and $\max\{m, t+1\} \le 2^b$, has minimum distance 8. FIG. 17 shows an example 1700 of six erasures in a same group using 4×8 arrays, according to an embodiment (i.e., using 4×8 arrays and l=2). Similarly as described regarding $C_{m,n,l}^{(1)}$ and $\hat{C}_{m,n,l}^{(1)}$, a modification of code $C_{m,n,l}^{(2)}$ may be used. Define the code $\hat{C}_{m,n,l}^{(2)}$ by giving an (m+2n+)×mn parity-check matrix over the field $GF(2^b)$, where now $\max\{m, t\} \le 2^b - 1$. Explicitly, the parity-check matrix of the [mn, mn−m−2(n−1)−l] code is given by Eq. 10 shown in FIG. 18. As described above, sometimes a smaller field may be used by using $C_{m,n,l}^{(2)}$ instead of $\hat{C}_{m,n,l}^{(2)}$. For example, $C_{256,12,3}^{(2)}$ can be constructed using the field GF(256), but a larger field is needed, such as GF(512), to construct $\hat{C}_{256,12,13}^{(2)}$. Consider the following example to illustrate the construction of $\hat{C}_{m,n,l}^{(2)}$.

In one example, consider the finite field GF(8) and, as in the example provided above, take 3×8 arrays, l=2 and let α be a primitive element in GF(8). Then, according to Eq. 10, the 13×24 parity-check matrix of code $\hat{C}_{3,8,2}^{(2)}$ is given by $\tilde{H}_{3,8,2}^{(1)}(H_0\ H_1\ \tilde{H}_2)$, where $H_0$ and $H_1$ are shown in view 1600 of FIG. 16, and $\tilde{H}_2$ is shown in view 1900 in FIG. 19. A theorem similar to that described above for $C_{m,n,l}^{(2)}$ is described as follows. The code $\hat{C}_{m,n,l}^{(2)}$ consisting of m×n arrays over $GF(2^b)$ whose parity-check matrix is given by Eq. 10 has a minimum distance of 8, where $\max\{m,t\}\leq 2^b-1$ and n=lt.

Figure 20:
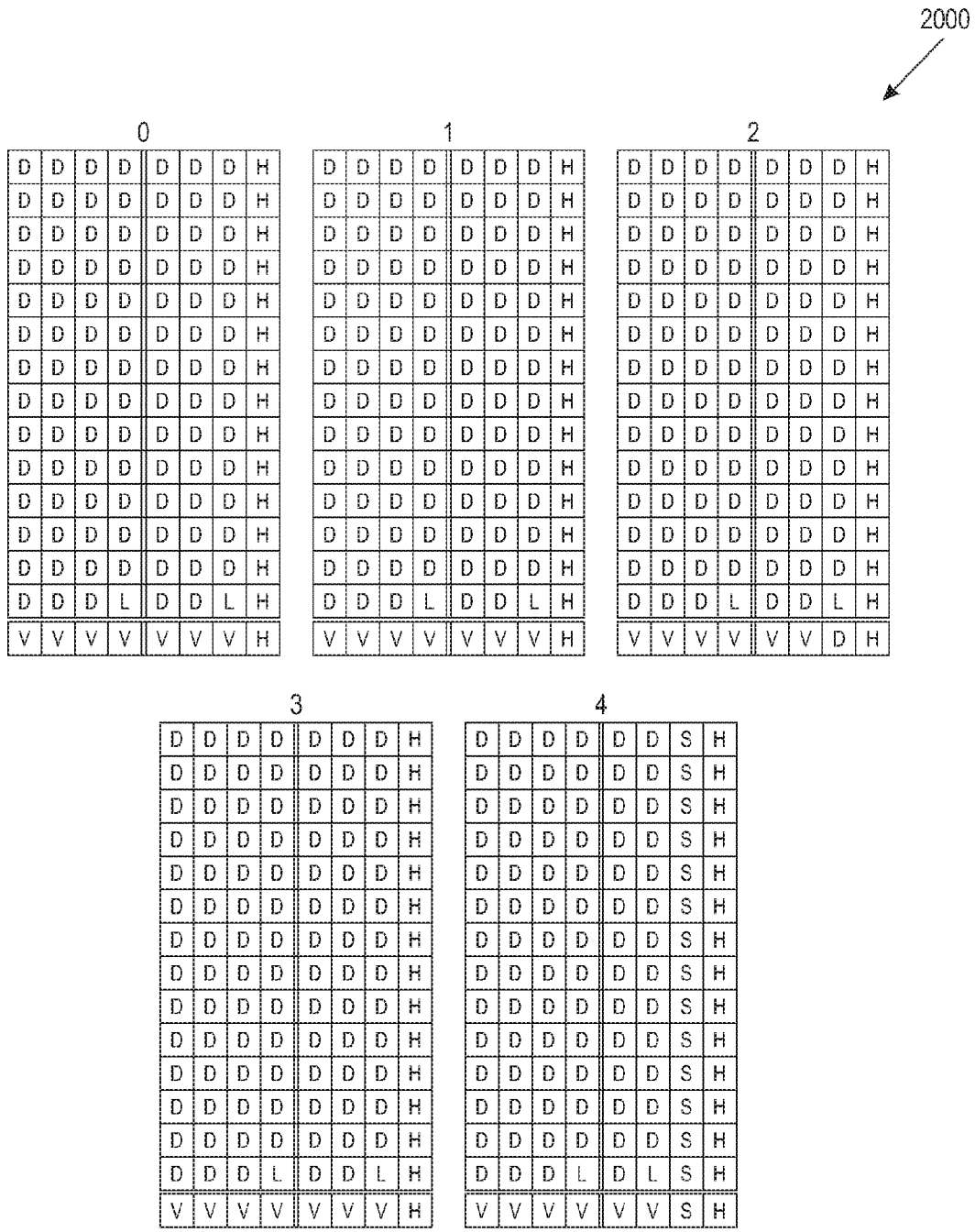
FIG. 20 shows five example arrays of 15×8 showing data symbols, horizontal and vertical parities, second responder parities and shared parities, according to an embodiment.

FIG. 20 shows a view 2000 of five example arrays of 15×8 showing data symbols, horizontal and vertical parities, second responder parities and shared parities, according to an embodiment (i.e., an array with w=5, m=15 and n=8 showing the data symbols (D, H and V parities, the second responder L parities and the shared S parities). Consider a number of w m×n arrays such that each array is encoded according to code $C_{m,n,l}^{(1)}$ described above. In addition, a column parity is added to one of the w arrays that is shared among all the parities. That second shared column parity, that is similar to the one of code $C_{m,n,l}^{(2)}$, allows for correction of 7 erasures anywhere, i.e., the minimum distance of the code is 8, similar to $C_{m,n,l}^{(2)}$. The code is illustrated in view 2000. In one example, given w m×n arrays with n=lt and $\max\{m,t+1\}\leq 2^b$, let the [mnw,w((m−1)(n−1)−l)−m+1] code $C_{m,n,l,w}$ be given by the [w(m+n+l)+m, wmn] parity-check matrix represented as Eq. 11 in FIG. 21.

As described above, w+1 of the rows of matrix $H_{m,n,l,w}$ are linearly dependent. The construction is illustrated with the following example. Consider the finite field GF(8). Take 3×8 arrays, w=3 and let α be a primitive element in GF(8). Then, according to Eq. 11, the parity-check matrix of code $C_{3,8,2,3}$ is given by the 42×72 matrix (four of the rows are linearly dependent, so $C_{3,8,2,3}$ is a [72,34] code)

$$H_{3,8,2,3} = \begin{pmatrix} H_{3,8,2}^{(1)} & \underline{0}_{13,24} & \underline{0}_{13,24} \\ \underline{0}_{13,24} & H_{3,8,2}^{(1)} & \underline{0}_{13,24} \\ \underline{0}_{13,24} & \underline{0}_{13,24} & H_{3,8,2}^{(1)} \\ H & H & H \end{pmatrix}$$

where $H_{3,8,2}^{(1)}$ is the 13×24 matrix provided above, $\underline{0}_{i,j}$ is an i×j zero matrix and H is the 3×24 matrix given by $$\begin{pmatrix} 1 & \alpha & \alpha^2 & \alpha^3 & \alpha^4 & \alpha^5 & \alpha^6 & \alpha^7 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 1 & \alpha & \alpha^2 & \alpha^3 & \alpha^4 & \alpha^5 & \alpha^6 & \alpha^7 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 1 & \alpha & \alpha^2 & \alpha^3 & \alpha^4 & \alpha^5 & \alpha^6 & \alpha^7 \end{pmatrix}.$$

Figure 24:
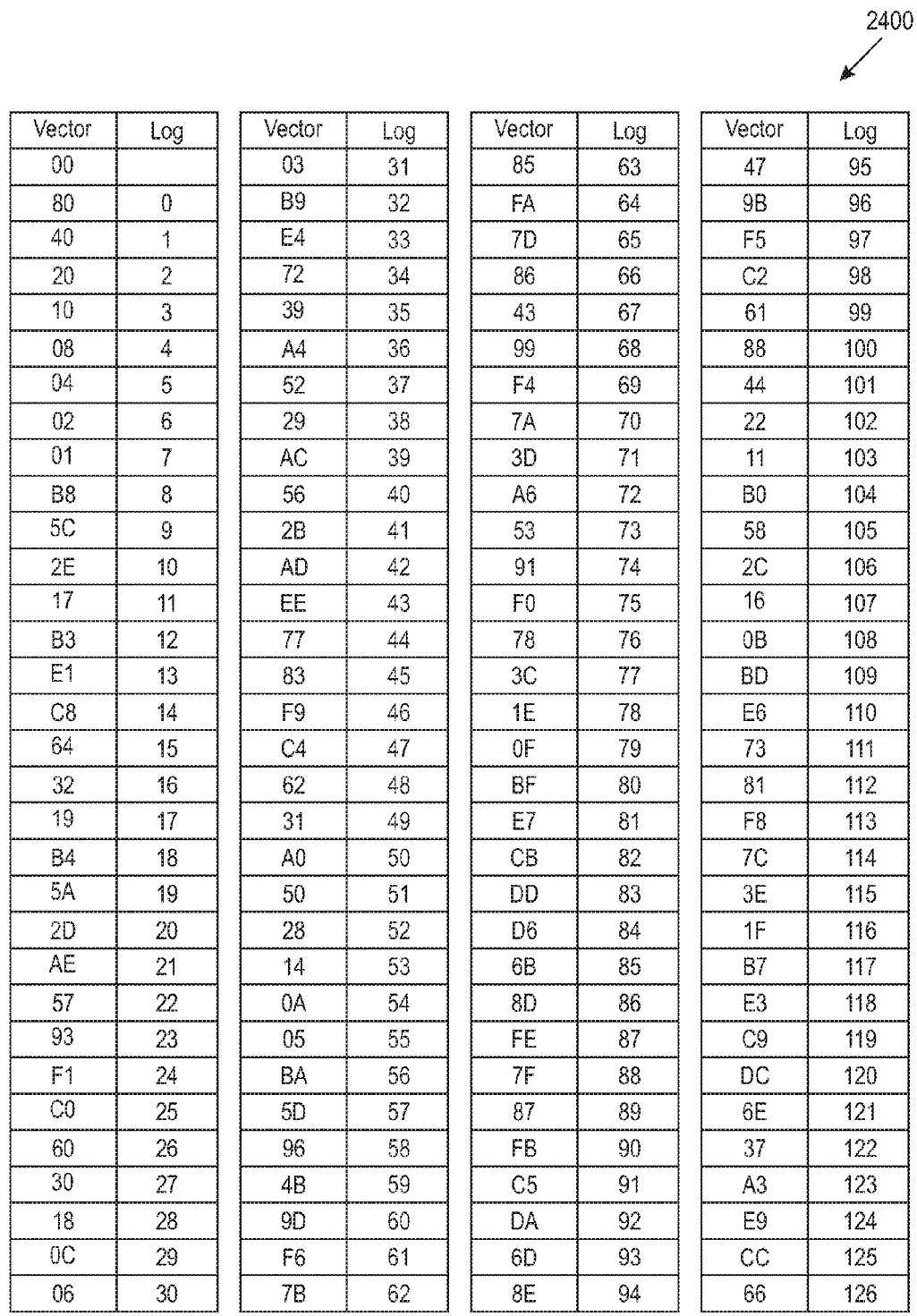
FIG. 24 shows a table of logarithms from 0 to 126 with values in hex, according to an embodiment.

In one embodiment, the following theorem gives the minimum distance of code $C_{m,n,l,w}$. The code $C_{m,n,l,w}$ whose parity-check matrix is given by Eq. 11, consisting of w m×n arrays over $GF(2^b)$, where n=lt and $\max\{m,n,t+1\}\leq 2^b$, has minimum distance 8. In one embodiment, the finite field GF(256) is used since this field is large enough for most applications and it allows for possible expansions without changing the hardware. Take as a primitive polynomial of the field $1+x^2+x^3+x^4+x^8$. The logarithms of the field are given in FIGS. 24 and 25 (FIG. 24 shows a view 2400 of a table of logarithms from 0 to 126 of the field GF(256) with primitive polynomial $1+x^2+x^3+x^4+x^8$; values are given in hex. FIG. 25 shows a view 2500 of a table of logarithms from 127 to 254 with values in hex). The vectors are written from most significant bit to least significant bit for the hexadecimal notation. Explicitly, the conversion from binary to hexadecimal is given in the table 2300 shown in FIG. 23. Multiplying by the 0 vector is always 0, but multiplying two non-zero vectors is given by the tables in FIGS. 24 and 25. For example, (10111011)(10111110)=(BB)(BE)=$\alpha^{204}\alpha^{243}$=$\alpha^{204+243\ (mod\ 255)}$=$\alpha^{192}$=(41)=(01000001).

In order to describe the encoding, the bytes in the code are denoted by $a_{i,j}^{(u)}$, where $0\leq u\leq w-1$, $0\leq i\leq m-1$ and $0\leq j\leq n$. For example, in FIG. 20 w=5, m=15, n=8 and l=2 (and hence t=4), and the horizontal parities H correspond to bytes $a_{i,j}^{(u)}$ for $0\leq u\leq 4$, $0\leq i\leq 14$, the vertical parities V to bytes $a_{m-1,j}^{(u)}$, for $0\leq u\leq 3$, $0\leq j\leq 6$ and u=4, $0\leq j\leq 5$, the second responder parities L to bytes $a_{m-2,j}^{(u)}$, where, if $0\leq u\leq 3$, $j\in\{3,6\}$, and if u=4, $j\in\{3,5\}$, and the shared parities S to bytes $a_{i,6}^{(4)}$, for $0\leq i\leq 14$. The remaining bytes $a_{i,j}^{(u)}$ correspond to the data symbols D. The role of the encoding is finding the parity bytes from the data bytes. Notice that the second responder parities L are placed in the last device of the corresponding parity group. The reason for that is that for each mounted device, its parities are computed and written together with the data, it is not desired to compute these a posteriori and remount a disk in order to write its parities.

Figure 22:
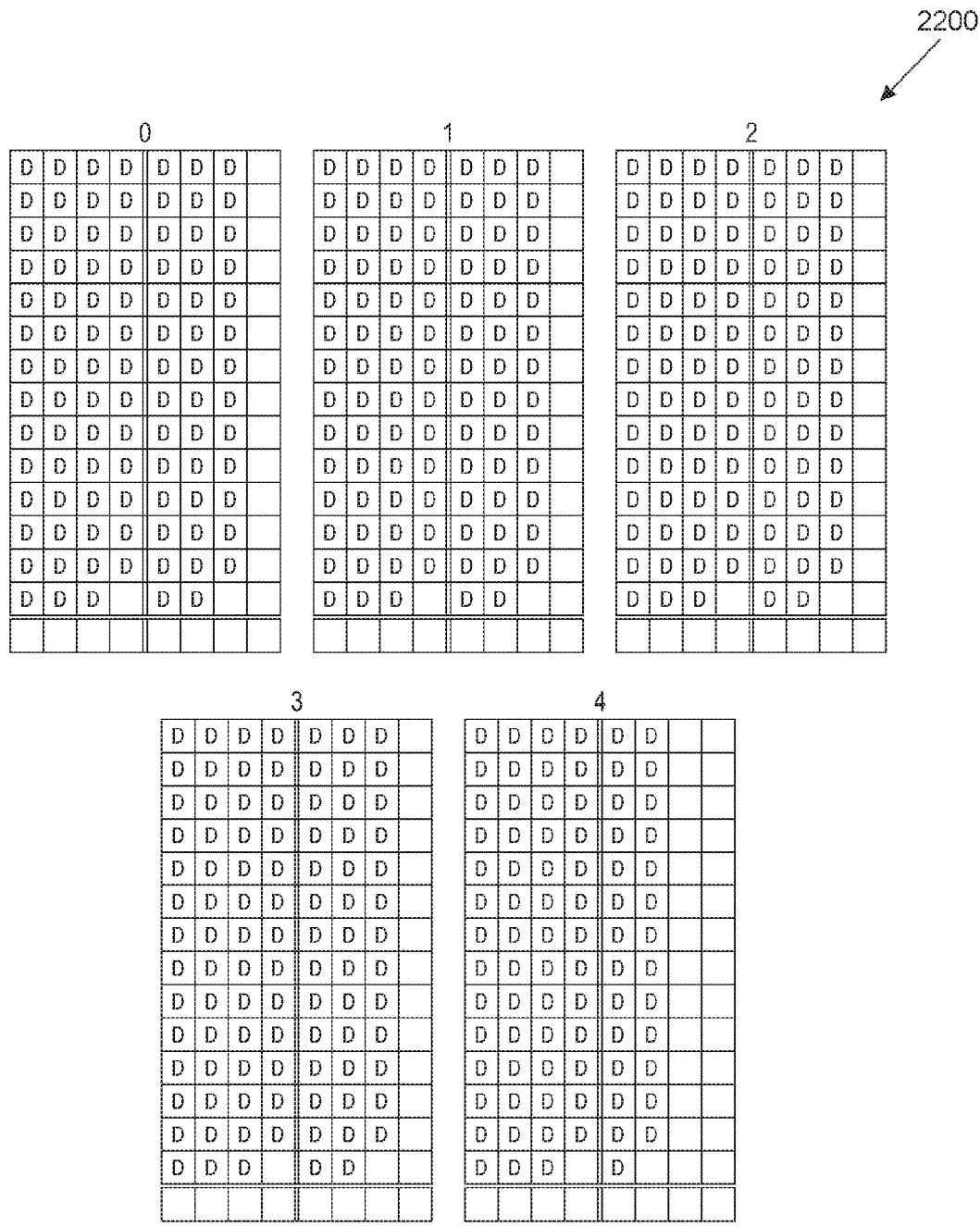
FIG. 22 shows five example arrays of 15×8 to be encoded, according to an embodiment.

In one example, assume that initially the parity bytes as well as the syndromes are equal to zero. Each device is mounted, one at a time. Then the syndromes are recomputed using the new data in the mounted device. Using these new recomputed syndromes, all the parities are computed and XORed with the parities in buffer. The encoding ends after the last device containing data is mounted. Then the final parities are computed and the encoding ends. The array to be encoded, showing only the data, is depicted in view 2200 in FIG. 22. The encoding processing is described below.

In one embodiment, assume that there is a string of data to be written, together with parity, in an array with parameters w, m, n and f with respect to the code given by parity-check matrix $H_{m,n,l,w}$, where $H_{m,n,l,w}$ is defined by Eq. 11. The string of data has length k=(w((m−1)(n−1))−l)−(m−1)

(the dimension of the code). In one embodiment, the encoding process proceeds as follows:

START: Make u←0 and j←0. Set $S_i^{(H),u}$=0 for $0\leq u\leq w-1$ and $0\leq i\leq m-1$, $S_{j'}^{(L),u}$=0 for $0\leq u\leq w-1$ and $0\leq j'\leq l-1$ and $S_i^{(S)}$=0 for $0\leq i\leq m-1$.

Step 0: Mount device j in array u and assume that all the devices in array u', u'<u if u≥1, have been mounted and their data and parities written, as well as the devices v in array u, where v<j if j≥1. Then:

(a) If u<w−1, j≠−1 (mod t) and j≠n−2, or, if u=w−1, j≠−1 (mod t) and j≠n−3, n−2, then go to Step 1.

(b) If j≠−1 (mod t) and j<(l−1)t then go to Step 2.

(c) If u<w−1 and j=n−2, then go to Step 3.

(d) Otherwise go to Step 4.

Step 1: The data to be written is represented by $a_{i,j}^{(u)}$ where $0 \leq i \leq m-2$. The system 300 computes the vertical parity symbol represented as Eq. 12 shown in FIG. 26 and writes the symbols $a_{i,j}^{(u)}$, $0 \leq i \leq m-1$ in the device.

Let $j' = \lfloor j/t \rfloor$. Recompute the syndromes represented as Eqs. 13-15 shown in FIG. 27.

Make $j \leftarrow j+1$ and go to Step 0.

Step 2: The data to be written is represented by $a_{i,j}^{(u)}$, where $0 \leq i \leq m-3$. Let $j' = \lfloor j/t \rfloor$. The system computes the syndromes represented as Eqs. 16-17 shown in FIG. 27.

Then the following linear system of two equations with two unknowns is processed:

$$a_{m-2,j}^{(u)} \oplus a_{m-1,j}^{(u)} = S_j^{(V),u}$$

$$\alpha^{-m-(j-j't)+2} a_{m-2,j}^{(u)} = S_j^{(L),u}$$

Solving this system, the system 300 obtains Eqs. 18-19 shown in FIG. 27. The system 300 writes the symbols $a_{i,j}^{(u)}$, $0 \leq i \leq m-1$, in the device. The system 300 computes the syndromes $S_i^{(H),u}$ using Eq. 13 and $S_i^{(S)}$ using Eq. 15. Make $j \leftarrow j+1$ and go to Step 0.

Step 3: The data to be written is represented by $a_{i,n-2}^{(u)}$, where $0 \leq i \leq m-3$. The system 300 computes the elements represented in Eq. 20 and the syndromes represented as Eqs. 21 and 22 in FIG. 27. Then the system solves the following linear system of four equations with four unknowns:

$$a_{m-2,n-2}^{(u)} \oplus a_{m-2,n-1}^{(u)} = S_{m-2}^{(H),u}$$
$$a_{m-1,n-2}^{(u)} \oplus a_{m-1,n-1}^{(u)} = S_{m-1}^{(H),u}$$
$$a_{m-2,n-1}^{(u)} \oplus a_{m-1,n-1}^{(u)} = S_{n-1}^{(V),u}$$
$$\alpha^{-m-t+4} a_{m-2,n-2}^{(u)} \oplus \alpha^{-m-t+3} a_{m-2,n-1}^{(u)} = S_{l-1}^{(L),u}$$

In order to solve this system, in one embodiment the system 300 triangulates the following 4×5 matrix:

$$\begin{pmatrix} 1 & 1 & 0 & 0 & S_{m-2}^{(H),u} \\ 0 & 0 & 1 & 1 & S_{m-1}^{(H),u} \\ 0 & 1 & 0 & 1 & S_{n-1}^{(V),u} \\ \alpha^{-m-t+4} & \alpha^{-m-t+3} & 0 & 0 & S_{m-1}^{(S)} \end{pmatrix}$$

$$\begin{pmatrix} 1 & 1 & 0 & 0 & S_{m-2}^{(H),u} \\ 0 & 1 & 0 & 1 & S_{n-1}^{(V),u} \\ 0 & 0 & 1 & 1 & S_{m-1}^{(H),u} \\ 0 & \alpha^{-m-t+3}(1 \oplus \alpha) & 0 & 0 & \alpha^{-m-t+4} S_{m-2}^{(H),u} \oplus S_{m-1}^{(S)} \end{pmatrix}$$

$$\begin{pmatrix} 1 & 1 & 0 & 0 & S_{m-2}^{(H),u} \\ 0 & 1 & 0 & 1 & S_{n-1}^{(V),u} \\ 0 & 0 & 1 & 1 & S_{m-1}^{(H),u} \\ 0 & 0 & 0 & \alpha^{-m-t+3}(1 \oplus \alpha) & \alpha^{-m-t+3}(1 \oplus \alpha) S_{n-1}^{(V),u} \oplus \alpha^{-m-t+4} S_{m-2}^{(H),u} \oplus S_{m-1}^{(S)} \end{pmatrix}$$

$$\begin{pmatrix} 1 & 1 & 0 & 0 & S_{m-2}^{(H),u} \\ 0 & 1 & 0 & 1 & S_{n-1}^{(V),u} \\ 0 & 0 & 1 & 1 & S_{m-1}^{(H),u} \\ 0 & 0 & 0 & 1 & S_{n-1}^{(V),u} \oplus \alpha 1 \oplus \alpha S_{m-2}^{(H),u} \oplus \alpha^{m+t-3} 1 \oplus \alpha S_{m-1}^{(S)} \end{pmatrix}$$

Solving this triangular form, the system 300 obtains Eqs. 23-26 shown in FIG. 28. The system 300 writes the symbols $a_{i,n-2}^{(u)}$, $0 \leq i \leq m-1$, in the device. The system 300 then mounts device n-1 of array u and write the symbols $a_{i,n-1}^{(u)}$, $0 \leq i \leq m-1$, in the device. The system 300 recomputes the syndromes represented as Eq. 27 shown in FIG. 28.

Make $u \leftarrow u+1$, $j \leftarrow 0$ and go to Step 0.

Step 4: The data to be written is represented by $a_{i,n-3}^{(w-1)}$, where $0 \leq i \leq -3$. The system 300 computes the syndromes represented as Eqs. 28-29 in FIG. 28.

Next, for each $0 \leq i \leq m-3$, the system 300 solves the system $$a_{i,n-2}^{(w-1)} \oplus a_{i,n-1}^{(w-1)} = S_i^{(H),w-1}$$

$$\alpha^{n-2} a_{i,n-2}^{(w-1)} \oplus \alpha^{n-1} a_{i,n-1}^{(w-1)} = S_i^{(S)}$$

Solving the system, for each $0 \leq i \leq m-3$ the system 300 obtains Eqs. 30-31 shown in FIG. 28.

Next the system 300 computes the syndromes represented as Eqs. 32-34 shown in FIG. 28. Then the system 300 solves the following system of 6 equations with 6 unknowns:

$$a_{m-2,n-3}^{(w-1)} \oplus a_{m-2,n-2}^{(w-1)} \oplus a_{m-2,n-1}^{(w-1)} = S_{m-2}^{(H),w-1}$$

$$a_{m-1,n-3}^{(w-1)} \oplus a_{m-1,n-2}^{(w-1)} \oplus a_{m-1,n-1}^{(w-1)} = S_{m-1}^{(H),w-1}$$

$$a_{m-2,n-2}^{(w-1)} \oplus a_{m-1,n-2}^{(w-1)} = S_{n-2}^{(H),w-1}$$

$$a_{m-2,n-1}^{(w-1)} \oplus a_{m-1,n-1}^{(w-1)} = S_{n-1}^{(H),w-1}$$

$$\alpha^{-m-t+5} a_{m-2,n-3}^{(w-1)} \oplus \alpha^{-m-t+4} a_{m-2,n-2}^{(w-1)} \oplus \alpha^{-m-t+3} a_{m-2,n-1}^{(w-1)} = S_{l-1}^{(H),w-1}$$

$$\alpha_{n-3} a_{m-1,n-3}^{(w-1)} \oplus \alpha^{n-2} a_{m-1,n-2}^{(w-1)} \oplus \alpha^{n-1} a_{m-1,n-1}^{(w-1)} = S_{m-1}^{(S)}$$

In order to solve this system, the system 300 triangulates the following 6×7 matrix:

$$\begin{pmatrix} 1 & 1 & 1 & 0 & 0 & 0 & S_{m-2}^{(H),w-1} \\ \alpha^{-m-t+5} & \alpha^{-m-t+4} & \alpha^{-m-t+3} & 0 & 0 & 0 & S_{l-1}^{(L),w-1} \\ 0 & 1 & 0 & 0 & 1 & 0 & S_{n-2}^{(V),w-1} \\ 0 & 0 & 1 & 0 & 0 & 1 & S_{n-1}^{(V),w-1} \\ 0 & 0 & 0 & 1 & 1 & 1 & S_{m-1}^{(H),w-1} \\ 0 & 0 & 0 & \alpha^{n-3} & \alpha^{n-2} & \alpha^{n-1} & S_{m-1}^{(S)} \end{pmatrix}$$

$$\begin{pmatrix} 1 & 1 & 1 & 0 & 0 & 0 & S_{m-2}^{(H),w-1} \\ 0 & 1 & 0 & 0 & 1 & 0 & S_{n-2}^{(V),w-1} \\ 0 & \alpha^{-m-t+4}(1 \oplus \alpha) & \alpha^{-m-t+3}(1 \oplus \alpha^2) & 0 & 0 & 0 & \gamma_1 \\ 0 & 0 & 1 & 0 & 0 & 1 & S_{n-1}^{(V),w-1} \\ 0 & 0 & 0 & 1 & 1 & 1 & S_{m-1}^{(H),w-1} \\ 0 & 0 & 0 & 0 & \alpha^{n-3}(1 \oplus \alpha) & \alpha^{n-3}(1 \oplus \alpha^2) & \gamma_2 \end{pmatrix}$$

where $\gamma_1$ and $\gamma_2$ are shown as Eqs. 35 and 36 in FIG. 29, $$\begin{pmatrix} 1 & 1 & 1 & 0 & 0 & 0 & S_{m-2}^{(H),w-1} \\ 0 & 1 & 0 & 0 & 1 & 0 & S_{n-2}^{(V),w-1} \\ 0 & 0 & 1 & 0 & 0 & 1 & S_{n-1}^{(V),w-1} \\ 0 & 0 & \alpha^{-m-t+3}(1 \oplus \alpha^2) & 0 & \alpha^{-m-t+4}(1 \oplus \alpha) & 0 & \gamma_3 \\ 0 & 0 & 0 & 1 & 1 & 1 & S_{m-1}^{(H),w-1} \\ 0 & 0 & 0 & 0 & \alpha^{n-3}(1 \oplus \alpha) & \alpha^{n-3}(1 \oplus \alpha^2) & \gamma_2 \end{pmatrix}$$

where $\gamma_3$ is shown as Eq. 37 in FIG. 29, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & \alpha^{-m-t+4}(1\oplus\alpha) & \alpha^{-m-t+3}(1\oplus\alpha^2) \\ 0 & 0 & 0 & 0 & \alpha^{n-3}(1\oplus\alpha) & \alpha^{n-3}(1\oplus\alpha^2) \end{pmatrix} \begin{pmatrix} S_{m-2}^{(H),w-1} \\ S_{n-2}^{(V),w-1} \\ S_{n-1}^{(V),w-1} \\ S_{m-1}^{(H),w-1} \\ \gamma_4 \\ \gamma_2 \end{pmatrix}$$

where $\gamma_4$ is shown as Eq. 38 in FIG. 29, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & 1 & \oplus\alpha^{-1} \\ 0 & 0 & 0 & 0 & 1 & \oplus\alpha \end{pmatrix} \begin{pmatrix} S_{m-2}^{(H),w-1} \\ S_{n-2}^{(V),w-1} \\ S_{n-1}^{(V),w-1} \\ S_{m-1}^{(H),w-1} \\ \gamma_5 \\ \gamma_6 \end{pmatrix}$$

where $\gamma_5$ and $\gamma_6$ are shown as Eqs. 39 and 40 in FIG. 29, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & 1 & \oplus\alpha^{-1} \\ 0 & 0 & 0 & 0 & 0 & \alpha\oplus\alpha^{-1} \end{pmatrix} \begin{pmatrix} S_{m-2}^{(H),w-1} \\ S_{n-2}^{(V),w-1} \\ S_{n-1}^{(V),w-1} \\ S_{m-1}^{(H),w-1} \\ \gamma_5 \\ \gamma_5 \oplus \gamma_6 \end{pmatrix}$$

$$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & 1 & \oplus\alpha^{-1} \\ 0 & 0 & 0 & 0 & 0 & 1 \end{pmatrix} \begin{pmatrix} S_{m-2}^{(H),w-1} \\ S_{n-2}^{(V),w-1} \\ S_{n-1}^{(V),w-1} \\ S_{m-1}^{(H),w-1} \\ \gamma_5 \\ \gamma_5 \oplus \gamma_6 \alpha \oplus \alpha^{-1} \end{pmatrix}$$

Solving this triangular form, the system 300 obtains Eqs. 41-46 shown in FIG. 29 where $\gamma_1$, $\gamma_2$, $\gamma_3$, $\gamma_4$, $\gamma_5$ and $\gamma_6$ are given by Eq. 35, Eq. 36, Eq. 37, Eq. 38, Eq. 39 and Eq. 40 respectively, completing the encoding.

In one example, consider the array in FIG. 30, where an array with w=5, m=16, n=8 and l=2 over GF(256) to be encoded is shown, the entries corresponding to data written in hex and the entries corresponding to parity being left blank. Using the encoding processing described above, the encoded array shown in FIG. 31 is obtained. In one embodiment, the decoding of code $C_{m,n,l,w}$ is shown as follows. In one embodiment, assume that we received an array $a_{i,j}^{(u)}$, where $0 \le u \le w-1$, $0 \le i \le m-1$, $0 \le j \le n-1$ and n=lt, such that some of the entries have possibly been erased, the array corresponding to an array in code $C_{m,n,l,w}$ given by parity-check matrix $H_{m,n,l,w}$, where $H_{m,n,l,w}$ is defined by Eq. 11 (FIG. 21). Then, system 300 proceeds with the following processing as follows to correct the erasures:

START: If there are no erasures, then output $a_{i,j}^{(u)}$, $0 \le u \le w-1$, $0 \le i \le m-1$ and $0 \le j \le n-1$, and go to EXIT. Otherwise, make $u \leftarrow 0$ and set $S_i^{(S)} = 0$ for $0 \le i \le m-1$.

Decoding in $C_{m,n,l}^{(1)}$: Correct all possible erasures in array $a_{i,j}^{(u)}$ using the processing as described above. Then, for each $0 \le i \le m-1$, the system 300 computes $$S_i^{(S)} \leftarrow S_i^{(S)} \oplus \bigoplus_{j=0}^{n-1} \alpha^j a_{i,j}^{(u)}$$

Make $u \leftarrow u+1$. If $u<w$, go to Decoding in $C_{m,n,l}^{(1)}$. Otherwise, if there are no erasures left, output $a_{i,j}^{(u)}$, $0 \le u \le w-1$, $0 \le i \le m-1$ and $0 \le j \le n-1$ and go to EXIT. If there are erasures remaining, make $i \leftarrow 0$ and $c \leftarrow 0$.

NEXT: If $a_{i,j}^{(u)}$, $0 \le u \le w-1$, $0 \le j \le n-1$, contains either no erasures or more than two erasures, then go to JUMP. Otherwise, make $c \leftarrow 1$ (c indicates that at least two erasures were corrected in this process) and assume that the two erased entries are $a_{i,j_0}^{(u)}$ and $a_{i,j_1}^{(u)}$ for some $0 \le u \le w-1$ and $0 \le j_0 < j_1 \le n-1$. Compute the horizontal syndrome $$S_i^{(H),u} = \bigoplus_{j=0}^{n-1} a_{i,j}^{(u)}.$$

The system 300 then solves the linear system of two equations with two unknowns $$a_{i,j_0}^{(u)} \oplus a_{i,j_1}^{(u)} = S_i^{(H),u}$$

$$\alpha^{j_0} a_{i,j_0}^{(u)} \oplus \alpha^{j_1} a_{i,j_1}^{(u)} = S_i^{(S)}$$

Solving this system, the system 300 obtains $$a_{i,j_1}^{(u)} = \frac{S_i^{(S)} \oplus \alpha^{j_0} S_i^{(H),u}}{\alpha^{j_0} \oplus \alpha^{j_1}}$$

$$a_{i,j_0}^{(u)} = a_{i,j_1}^{(u)} \oplus S_i^{(H),u}$$

JUMP: Make $i \leftarrow i+1$. If $i=m$, then go to MAIN. Otherwise, go to NEXT.

MAIN: If there are no erasures left, then output $a_{i,j}^{(u)}$, $0 \le u \le w-1$, $0 \le i \le m-1$ and $0 \le j \le n-1$, and go to EXIT. If c=1, then go to START. If c=0 and there are more than six erasures, declare an uncorrectable error and go to EXIT. Otherwise assume that the six erased entries are $a_{i_0,st+j_0}^{(u)}$, $a_{i_0,st+j_1}^{(u)}$, $a_{i_0,st+j_2}^{(u)}$, $a_{i_1,st+j_0}^{(u)}$, $a_{i_1,st+j_1}^{(u)}$ and $a_{i_1,st+j_2}^{(u)}$, where $0 \le u \le w-1$, $0 \le i_0 < i_1 \le m-1$, $0 \le s \le l-1$ and $0 \le j_0 < j_1 < j_2 \le n-1$.

Next the system 300 computes the syndromes represented as Eqs. 47-51 shown in FIG. 32.

Assume first that $i_1 < m-1$. The system 300 then solves the following system of 6 equations with 6 unknowns:

$$a_{i_0,st+j_0}^{(u)} \oplus a_{i_0,st+j_1}^{(u)} \oplus a_{i_0,st+j_2}^{(u)} = S_{i_0}^{(H),u}$$

$$a_{i_1,st+j_0}^{(u)} \oplus a_{i_1,st+j_1}^{(u)} \oplus a_{i_1,st+j_2}^{(u)} = S_{i_1}^{(H),u}$$

$$a_{i_0,st+j_1}^{(u)} \oplus a_{i_1,st+j_1}^{(u)} = S_{st+j_1}^{(V),u}$$

$$\alpha^{-i_0-j_0} a_{i_0,st+j_0}^{(u)} \oplus \alpha^{-i_0-j_1} a_{i_0,st+j_1}^{(u)}$$
$$\oplus \alpha^{-i_0-j_2} a_{i_0,st+j_2}^{(u)} \oplus \alpha^{-i_1-j_0} a_{i_1,st+j_0}^{(u)}$$
$$\oplus \alpha^{-i_1-j_1} a_{i_1,st+j_1}^{(u)} \oplus \alpha^{-i_1-j_2} a_{i_1,st+j_2}^{(u)} = S_s^{(L),u}$$

In order to solve this system, the system 300 triangulates the following 6×7 matrix:

$$\begin{pmatrix} 1 & 1 & 1 & 0 & 0 & 0 \\ \alpha^{-i_0-j_0} & \alpha^{-i_0-j_1} & \alpha^{-i_0-j_2} & \alpha^{-i_1-j_0} & \alpha^{-i_1-j_1} & \alpha^{-i_1-j_2} \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & \alpha^{j_0} & \alpha^{j_1} & \alpha^{j_2} \end{pmatrix} \begin{vmatrix} S_{i_0}^{(H),u} \\ S_s^{(L),u} \\ S_{j_1}^{(V),u} \\ S_{j_2}^{(V),u} \\ S_{i_1}^{(H),u} \\ \alpha^{-st}S_{i_1}^{(S)} \end{vmatrix}$$

$$\begin{pmatrix} 1 & 1 & 1 & 0 & 0 & 0 \\ 0 & 1 & 0 & 0 & 1 & 0 \\ 0 & \alpha^{-i_0-j_0}\oplus\alpha^{-i_0-j_1} & \alpha^{-i_0-j_0}\oplus\alpha^{-i_0-j_2} & \alpha^{-i_1-j_0} & \alpha^{-i_1-j_1} & \alpha^{-i_1-j_2} \\ 0 & 0 & 1 & 0 & 0 & 1 \\ 0 & 0 & 0 & 1 & 1 & 1 \\ 0 & 0 & 0 & 0 & \alpha^{j_0}\oplus\alpha^{j_1} & \alpha^{j_0}\oplus\alpha^{j_2} \end{pmatrix} \begin{vmatrix} S_{i_0}^{(H),u} \\ S_{j_1}^{(V),u} \\ \gamma_1 \\ S_{j_2}^{(V),u} \\ S_{i_1}^{(H),u} \\ \gamma_2 \end{vmatrix}$$

where $\gamma_1$ and $\gamma_2$ are shown as Eqs. 52 and 52 in FIG. 32, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & \alpha^{-i_0-j_0}\oplus\alpha^{-i_0-j_2} & \alpha^{-i_1-j_0} & \alpha^{-i_0-j_1}\oplus\alpha^{-i_1-j_1} & \alpha^{-i_1-j_2} \\ 0 & 0 & 0 & 1 & 1 & 1 \\ 0 & 0 & 0 & 0 & \alpha^{j_0}\oplus\alpha^{j_1} & \alpha^{j_0}\oplus\alpha^{j_2} \end{pmatrix} \begin{vmatrix} S_{i_0}^{(H),u} \\ S_{st+j_1}^{(V),u} \\ S_{st+j_2}^{(V),u} \\ \gamma_3 \\ S_{i_1}^{(H),u} \\ \gamma_2 \end{vmatrix}$$

where $\gamma_3$ is shown as Eq. 54 in FIG. 32, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & \alpha^{-i_1-j_0} & \alpha^{-i_0-j_0}\oplus\alpha^{-i_0-j_1}\oplus\alpha^{-i_1-j_1} & \alpha^{-i_0-j_0}\oplus\alpha^{-i_0-j_2}\oplus\alpha^{-i_1-j_2} \\ 0 & 0 & 0 & 0 & \alpha^{j_0}\oplus\alpha^{j_1} & \alpha^{j_0}\oplus\alpha^{j_2} \end{pmatrix} \begin{vmatrix} S_{i_0}^{(H),u} \\ S_{st+j_1}^{(V),u} \\ S_{st+j_2}^{(V),u} \\ S_{i_1}^{(H),u} \\ \gamma_4 \\ \gamma_2 \end{vmatrix}$$

where $\gamma_4$ is shown as Eq. 55 in FIG. 32, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & 1 & \frac{\alpha^{-j_0}\oplus\alpha^{-j_2}}{\alpha^{-j_0}\oplus\alpha^{-j_1}} \\ 0 & 0 & 0 & 0 & 1 & \frac{\alpha^{j_0}\oplus\alpha^{j_2}}{\alpha^{j_0}\oplus\alpha^{j_1}} \end{pmatrix} \begin{vmatrix} S_{i_0}^{(H),u} \\ S_{st+j_1}^{(V),u} \\ S_{st+j_2}^{(V),u} \\ S_{i_1}^{(H),u} \\ \gamma_5 \\ \gamma_6 \end{vmatrix}$$

where $\gamma_5$ and $\gamma_6$ are shown as Eqs. 56-57 in FIG. 32, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & 0 & 1 & \frac{\alpha^{-j_0}\oplus\alpha^{-j_2}}{\alpha^{-j_0}\oplus\alpha^{-j_1}} \\ 0 & 0 & 0 & 0 & 0 & 1 \end{pmatrix} \begin{vmatrix} S_{i_0}^{(H),u} \\ S_{st+j_1}^{(V),u} \\ S_{st+j_2}^{(V),u} \\ S_{i_1}^{(H),u} \\ \gamma_5 \\ \frac{(\alpha^{j_0}\oplus\alpha^{j_1})(\gamma_5\oplus\gamma_6)}{(1\oplus\alpha^{-(j_2-j_1)})(\alpha^{j_0}\oplus\alpha^{j_2})} \end{vmatrix}$$

Solving this triangular form, the system 300 obtains Eqs. 58-63 shown in FIG. 33 where $\gamma_1$, $\gamma_2$, $\gamma_3$, $\gamma_4$, $\gamma_5$ and $\gamma_6$ are given by Eq. 52, Eq. 53, Eq. 54, Eq. 55, Eq. 56 and Eq. 57 respectively. Assume finally that $i_1=m-1$. The system 300 solves the following system of 6 equations with 6 unknowns:

$$a_{i_0,st+j_0}^{(u)}\oplus a_{i_0,st+j_1}^{(u)}\oplus a_{i_0,st+j_2}^{(u)} = S_{i_0}^{(H),u}$$

$$a_{m-1,st+j_0}^{(u)}\oplus a_{m-1,st+j_1}^{(u)}\oplus a_{m-1,st+j_2}^{(u)} = S_{m-1}^{(H),u}$$

$$a_{i_0,st+j_1}^{(u)}\oplus a_{m-1,st+j_1}^{(u)} = S_{st+j_1}^{(V),u}$$

$$a_{i_0,st+j_2}^{(u)}\oplus a_{m-1,st+j_2}^{(u)} = S_{st+j_2}^{(V),u}$$

$$\alpha^{-i_0-j_0}a_{i_0,st+j_0}^{(u)}\oplus\alpha^{-i_0-j_1}a_{i_0,st+j_1}^{(u)} \oplus \alpha^{-i_0-j_2}a_{i_0,st+j_2}^{(u)} = S_s^{(L),u}$$

$$\alpha^{st+j_0}a_{m-1,st+j_0}^{(u)}\oplus\alpha^{st+j_1}a_{m-1,st+j_1}^{(u)} \oplus\alpha^{st+j_2}a_{m-1,st+j_2}^{(u)} = S_{m-1}^{(S)}$$

In order to solve this system, the system 300 triangulates the following 6×7 matrix:

$$\begin{pmatrix} 1 & 1 & 1 & 0 & 0 & 0 \\ \alpha^{-i_0-j_0} & \alpha^{-i_0-j_1} & \alpha^{-i_0-j_2} & 0 & 0 & 0 \\ 0 & 1 & 0 & 0 & 1 & 0 \\ 0 & 0 & 1 & 0 & 0 & 1 \\ 0 & 0 & 0 & 1 & 1 & 1 \\ 0 & 0 & 0 & \alpha^{j_0} & \alpha^{j_1} & \alpha^{j_2} \end{pmatrix} \begin{vmatrix} S_{i_0}^{(H),u} \\ S_s^{(L),u} \\ S_{j_1}^{(V),u} \\ S_{j_2}^{(V),u} \\ S_{m-1}^{(H),u} \\ \alpha^{-st}S_{m-1}^{(S)} \end{vmatrix}$$

$$\begin{pmatrix} 1 & 1 & 1 & 0 & 0 & 0 \\ 0 & 1 & 0 & 0 & 1 & 0 \\ 0 & \alpha^{-i_0-j_0}\oplus\alpha^{-i_0-j_1} & \alpha^{-i_0-j_0}\oplus\alpha^{-i_0-j_2} & 0 & 0 & 0 \\ 0 & 0 & 1 & 0 & 0 & 1 \\ 0 & 0 & 0 & 1 & 1 & 1 \\ 0 & 0 & 0 & 0 & \alpha^{j_0}\oplus\alpha^{j_1} & \alpha^{j_0}\oplus\alpha^{j_2} \end{pmatrix} \begin{vmatrix} S_{i_0}^{(H),u} \\ S_{j_1}^{(V),u} \\ \gamma_1 \\ S_{j_2}^{(V),u} \\ S_{m-1}^{(H),u} \\ \gamma_2 \end{vmatrix}$$

where $\gamma_1$ is given by Eq. 52 and $\gamma_2$ is shown as Eq. 64 in FIG. 33, $$\begin{pmatrix} 1 & 1 & 1 & 0 & 0 & 0 \\ 0 & 1 & 0 & 0 & 1 & 0 \\ 0 & 0 & 1 & 0 & 0 & 1 \\ 0 & 0 & \alpha^{-i_0-j_0}\oplus\alpha^{-i_0-j_2} & 0 & \alpha^{-i_0-j_0}\oplus\alpha^{-i_0-j_1} & 0 \\ 0 & 0 & 0 & 1 & 1 & 1 \\ 0 & 0 & 0 & 0 & \alpha^{j_0}\oplus\alpha^{j_1} & \alpha^{j_0}\oplus\alpha^{j_2} \end{pmatrix} \begin{vmatrix} S_{i_0}^{(H),u} \\ S_{st+j_1}^{(V),u} \\ S_{st+j_2}^{(V),u} \\ \gamma_3 \\ S_{m-1}^{(H),u} \\ \gamma_2 \end{vmatrix}$$

where $\gamma_3$ is given by Eq. 54, $$\begin{pmatrix} 1 & 1 & 1 & 0 & 0 & 0 & S_{i_0}^{(H),u} \\ 0 & 1 & 0 & 0 & 1 & 0 & S_{st+j_1}^{(V),u} \\ 0 & 0 & 1 & 0 & 0 & 1 & S_{st+j_2}^{(V),u} \\ 0 & 0 & 0 & 1 & 1 & 1 & S_{m-1}^{(H),u} \\ 0 & 0 & 0 & 0 & \alpha^{-i_0-j_0} \oplus \alpha^{-i_0-j_1} & \alpha^{-i_0-j_0} \oplus \alpha^{-i_0-j_2} & \gamma_4 \\ 0 & 0 & 0 & 0 & \alpha^{j_0} \oplus \alpha^{j_1} & \alpha^{j_0} \oplus \alpha^{j_2} & \gamma_2 \end{pmatrix}$$

where $\gamma_4$ is given by Eq. 55, $$\begin{pmatrix} 1 & 1 & 1 & 0 & 0 & 0 & S_{i_0}^{(H),u} \\ 0 & 1 & 0 & 0 & 1 & 0 & S_{st+j_1}^{(V),u} \\ 0 & 0 & 1 & 0 & 0 & 1 & S_{st+j_2}^{(V),u} \\ 0 & 0 & 0 & 1 & 1 & 1 & S_{m-1}^{(H),u} \\ 0 & 0 & 0 & 0 & 1 & \frac{\alpha^{j_0} \oplus \alpha^{j_2}}{\alpha^{j_0} \oplus \alpha^{j_1}} & \gamma_5 \\ 0 & 0 & 0 & 0 & 0 & 1 & \gamma_6 \end{pmatrix}$$

where $\gamma_5$ is given as Eq. 65 in FIG. 33. Solving this triangular form, the system 300 obtains Eqs. 66-71 shown in FIG. 33, where $\gamma_1$, $\gamma_2$, $\gamma_3$, $\gamma_4$ and $\gamma_5$ are given by Eq. 52, Eq. 64, Eq. 54, Eq. 55 and Eq. 65 respectively.

EXIT:

In one example, as provided above, consider the array in FIG. 34, where an array with w=5, m=16, n=8 and l=2 over GF(256) to be decoded, the entries corresponding to data written in hex and the entries corresponding to erased symbols being left blank. Using the decoding method described, the encoded array of FIG. 35 is obtained.

In one embodiment, an implementation using the ring of polynomials modulo $M_p(x)=1+x+x^2+\ldots+x^{p-1}$, where p is a prime number is described below. When $M_p(x)$ is irreducible, the ring is a field. However, this approach works when $M_p(x)$ is not irreducible also, i.e., the polynomials modulo $M_p(x)$ are a ring. There is a simple criterium to decide if $M_p(x)$ is irreducible: $M_p(x)$ is irreducible if and only if 2 is primitive in GF(p). For example, $M_5(x)$ is irreducible, but $M_7(x)$ is not. Using the ring of polynomials modulo $M_p(x)$ is desirable because the encoding and decoding operations can be performed using only XOR operations. This way, look-up tables can be omitted. In one example, $\alpha^i$, where $0 \le i \le p-2$ represents the vector modulo $M_p(x)$ in which all the coordinates are zero except for coordinate i, which is 1. For example, $\alpha^3 = (0\ 0\ 0\ 1\ 0\ 0)$ modulo $M_7(x)$. Note that $\alpha^p=1$ (and hence $\alpha^{-i}=\alpha^{p-i}$) and $\alpha^{p-1}=\oplus_{i=0}^{p-2}\alpha^i$. Multiplying a vector by $\alpha^i$ (and hence two vectors among themselves) is easy for system 300 to perform: it simply involves rotating the vector i times to the right modulo $1+x^p$, and then XORing the result with the p th coordinate.

In one example, take the vector $\underline{v}=(1\ 0\ 1\ 1\ 1\ 0)=1+\alpha^2+\alpha^3+\alpha^4$. Then, $$\alpha^3 \underline{v} = \alpha^3 + \alpha^5 + \alpha^6 + \alpha^7$$
$$= 1 + \alpha^3 + \alpha^5 + \alpha^6$$
$$= \alpha + \alpha^2 + \alpha^4$$
$$= (011010).$$

The next step is, given $a(\alpha)=\oplus_{i=0}^{p-2}a_i\alpha^i$, finding $$b(\alpha) = \bigoplus_{i=0}^{p-2} b_i \alpha^i = \frac{a(\alpha)}{1 \oplus \alpha^i}.$$

Given an integer m, the notation $<m>_p$ denotes the unique i, $0 \le i \le p-1$, such that $i \equiv m \pmod{p}$. For example, $<8>_5=3$ and $<-3>_5=2$. Thus, the values of the coefficients of $b(\alpha)$ are given by the recursion (assuming initially $b_{p-1}=0$) represented as Eq. 72 in FIG. 36. For example, assume p=7. Then, applying the recursion given by Eq. 72, the system 300 obtains $$\frac{(100101)}{1 \oplus \alpha^2} = \frac{1 \oplus \alpha^3 \oplus \alpha^5}{1 \oplus \alpha^2} = (110111) = 1 \oplus \alpha \oplus \alpha^3 \oplus \alpha^4 \oplus \alpha^5.$$

In one embodiment, the codes definitions provided above as well as the encoding and decoding processing is applied to vectors in the ring of polynomials modulo $M_p(x)$. No look-up tables will be necessary and all the operations are XOR operations. In one example, the codes $C_{m,n,l}^{(1)}$, $C_{m,n,l}^{(2)}$ and $C_{m,n,l,w}$ are defined as modulo $M_p(x)$. The theorems described above continue to be valid. However, these are rephrased so that they are in an explicit form establishing the relationship between p, m, n, l and t. Denote by R(p) the ring of integers modulo $M_p(x)$.

In one embodiment, the code $C_{m,n,l}^{(1)}$ consisting of m×n arrays over the ring R(p) whose parity-check matrix is given by Eq. 1 (FIG. 5) has minimum distance 6, where max{m, t+1}≤p+1 and n=lt. In one embodiment, the code $\hat{C}_{m,n,l}^{(1)}$ consisting of m×n arrays over the ring R(p) whose parity-check matrix is given by Eq. 2 (FIG. 10) has minimum distance of 6, where max{m, t}≤p and n=lt. Next the decoding processing described above is adapted to code $C_{m,n,l}^{(1)}$ over the ring R(p).

In one example, consider code $\hat{C}_{m,n,l}^{(1)}$. Assume that an m×n array, max{m, t}≤p and $$n = lt, (a_{i,j})_{0 \le i \le m-1, 0 \le j \le n-1}$$

is received, possibly containing erasures. In one embodiment, the processing proceeds as follows:

START: Make u←0 and j←0.

First Responder: If entry $a_{i_0,ut+j}$ has been erased and there are no other erasures in column j, make $$a_{i_0,ut+j} = \bigoplus_{\substack{i=0 \\ i \ne i_0}}^{m-1} a_{i,ut+j}$$

Make j←j+1. If j<t go to First Responder.

Second Responder: If there are either no erasures or more than two erasures in columns ut+j, 0≤j≤t−1, then go to Third Responder. If there are exactly two erasures in entries $a_{i_0,ut+j_0}$ and $a_{i_1,ut+j_0}$, where $0 \le i_0 < i_1 \le n-1$ and $0 \le j_0 \le t-1$, and the remaining entries $a_{t,ut+j}$ are erasure free, then, assuming $a_{i_0,ut+j_0}=0$ and $a_{i_1,ut+j_0}=0$, system 300 computes the syndromes represented as Eqs. 73 and 74 in FIG. 36. and make $$a_{i_1, ut+j_0} = \frac{\alpha^{j_1-i_0} S_{u,j_0}^{(V)} \oplus \alpha^{j_1+j_0} S_u^{(L)}}{1 \oplus \alpha^{j_1-i_0}}$$

$$a_{i_0, ut+j_0} = a_{i_1, ut+j_0} \oplus S_{u,j_0}^{(V)},$$

where division by $1 \oplus \alpha^{i_1-i_0}$ is given by Eq. 72.

Third Responder: Make u←u+1. If u<l then make j←0 and go to First Responder. Otherwise, if u=l and there are no more erasures, then output $(a_{i,j})_{0 \leq i \leq m-1, 0 \leq j \leq n-1}$ and go to EXIT. If there are no rows with exactly one erasure, then go to Fourth Responder. If there are rows with exactly one erasure, then, for each row is with exactly one erasure in location $a_{i_s, j_s}$, where $0 \leq i_s \leq m-1$ and $0 \leq j_s \leq n-1$, make $$a_{i_s, j_s} = \bigoplus_{\substack{j=0 \\ j \neq j_s}}^{n-1} a_{i_s, j}$$

If there are no more erasures, then output $$(a_{i,j})_{0 \leq i \leq m-1, \, 0 \leq i \leq m-1}$$

and go to EXIT, otherwise, go to START.

Fourth Responder: If the number of erasures is greater than 4, then declare an uncorrectable error and go to EXIT. Otherwise, assume that the erasures occurred in locations $a_{i_0, ut+j_0}, a_{i_0, ut+j_1}, a_{i_1, ut+j_1}$ and $a_{i_1, ut+j_1}$, where $0 \leq i_0 < i_1 \leq m-1$, $0 \leq u \leq s-1$ and $0 \leq j_0 < j_1 \leq t-1$. Making these locations equal to zero, compute the syndromes represented as Eqs. 75-78 and make $$a_{i_1, ut+j_1} = \frac{\alpha^{-(i_1-i_0)} S_{i_1}^{(H)} \oplus (1 \oplus \alpha^{-(j_1-j_0)}) S_{u,j_1}^{(V)} \oplus S_{i_0}^{(H)} \oplus \alpha^{i_0+j_0} S_u^{(L)}}{(1 \oplus \alpha^{-(i_1-i_0)})(1 \oplus \alpha^{-(j_1-j_0)})}$$

$$a_{i_1, ut+j_0} = a_{i_1, ut+j_1} \oplus S_{i_1}^{(H)},$$

$$a_{i_0, ut+j_1} = a_{i_1, ut+j_1} \oplus S_{u,j_1}^{(V)}$$

$$a_{i_0, ut+j_0} = a_{i_0, ut+j_1} \oplus S_{i_0}^{(H)}.$$

EXIT:

Next, the general construction, always over $R_p$ is described. In one embodiment, consider the code $\hat{C}_{m,n,l,w}$ over $R_p$, which consists of w m×n arrays with n=lt and max{m, t}≤p, let the [mnw,w((m−1)(n−1)−l)−m+1] code $\hat{C}_{m,n,l,w}$ be given by the [w(m+n+l)+m,wmn] parity-check matrix shown as Eq. 79 in FIG. 36. As described above, w+1 of the rows of matrix $H_{m,n,l,w}$ are linearly dependent. The following theorem provides the minimum distance of code $\hat{C}_{m,n,l,w}$.

In one embodiment, the code $\hat{C}_{m,n,l,w}$ whose parity-check matrix is given by Eq. 79 (FIG. 36), consisting of w m×n arrays over $R_p$, where n=lt and max{m,n,t}≤p, has minimum distance 8. The following describes the decoding processing by system 300 of $\hat{C}_{m,n,l,w}$ over $R_p$.

In one embodiment, assume that system 300 received an array $a_{i,j}^{(u)}$, where $0 \leq u \leq w-1$, $0 \leq i \leq m-1$, $0 \leq j \leq n-1$ and n=lt, such that some of the entries have possibly been erased, the array corresponding to an array in code $\hat{C}_{m,n,l,w}$ over $R_p$ given by parity-check matrix $\tilde{H}_{m,n,l,w}$, where $\tilde{H}_{m,n,l,w}$ is defined by Eq. 79. Then, system 300 proceeds as follows to correct the erasures:

START: If there are no erasures, then output $a_{i,j}^{(u)}$, $0 \leq u \leq w-1$, $0 \leq i \leq m-1$ and $0 \leq j \leq n-1$, and go to EXIT. Otherwise, make u←0 and set $S_i^{(S)}=0$ for $0 \leq i \leq m-1$.

Decoding in $\hat{C}_{m,n,l}^{(1)}$: Correct all possible erasures in array $a_{i,j}^{(u)}$ using processing described above. Then, for each $0 \leq i \leq m-1$, the system 300 computes $$S_i^{(S)} \leftarrow S_i^{(S)} \oplus \bigoplus_{j=0}^{n-1} \alpha^j a_{i,j}^{(u)}$$

Make u←u+1. If u<w, go to Decoding in $\hat{C}_{m,n,l}^{(1)}$. Otherwise, if there are no erasures left, output $a_{i,j}^{(u)}$, $0 \leq u \leq w-1$, $0 \leq i \leq m-1$ and $0 \leq j \leq n-1$ and go to EXIT. If there are erasures remaining, make i←0 and c←0.

NEXT: If $a_{i,j}^{(u)}$, $0 \leq u \leq w-1$ and $0 \leq j \leq n-1$, contains either no erasures or more than two erasures, then go to JUMP. Otherwise, make c←1 (c indicates that at least two erasures were corrected in this process) and assume that the two erased entries are $a_{i,j_0}^{(u)}$ and $a_{i,j_1}^{(u)}$ for some $0 \leq u \leq w-1$ and $0 \leq j_0 < j_1 \leq n-1$. The system 300 computes the horizontal syndrome $$S_i^{(H),u} = \bigoplus_{j=0}^{n-1} a_{i,j}^{(u)}.$$

Then, $$a_{i,j_1}^{(u)} = \frac{\alpha^{-j_0} S_i^{(S)} \oplus S_i^{(H),u}}{1 \oplus \alpha^{j_1-j_0}}$$

$$a_{i,j_0}^{(u)} = a_{i,j_1}^{(u)} \oplus S_i^{(H),u}$$

JUMP: Make i←i+1. If i=m, then go to MAIN. Otherwise, go to NEXT.

MAIN: If there are no erasures left, then output $a_{i,j}^{(u)}$, $0 \leq u \leq w-1$, $0 \leq i \leq m-1$ and $0 \leq j \leq n-1$, and go to EXIT. If c=1, then go to START. If c=0 and there are more than six erasures, declare an uncorrectable error and go to EXIT. Otherwise assume that the six erased entries are $a_{i_0, st+j_0}$, $a_{i_0, st+j_1}$, $a_{i_0, st+j_2}$, $a_{i_1, st+j_0}$, $a_{i_1, st+j_1}$ and $a_{i_1, st+j_2}$, where $0 \leq u \leq w-1$, $0 \leq i_0 < i_1 \leq m-1$, $0 \leq s \leq l-1$ and $0 \leq j_0 < j_1 < j_2 \leq t-1$. Next the system 300 computes the syndromes represented as Eqs. 80-84 in FIG. 37, and let $\gamma_1$ to $\gamma_6$ be represented as Eqs. 85-90. Then Eqs. 91-96 are arrived at as shown in FIG. 38 where $\gamma_1$, $\gamma_2$, $\gamma_3$, $\gamma_4$, $\gamma_5$ and $\gamma_6$ are given by Eq. 85, Eq. 86, Eq. 87, Eq. 88, Eq. 89 and Eq. 90 respectively.

EXIT

FIG. 39 illustrates a block diagram for a process 3900 for hierarchical correction coding, according to one embodiment. In one embodiment, in block 3910, process 3900 includes converting data for a storage system (e.g., number of storage devices, etc.) into a number of w storage device arrays, each storage device array including n storage devices, and each storage device divided into m sectors or pages, w, n, and m are positive integers. In block 3920 process 3900 provides grouping the n storage devices into l groups of t storage devices each, where l and t are positive integers. In block 3930 process 3900 provides for correcting erasures in the number of w storage device arrays based on protecting each row and column in each m×n array by an erasure-correcting code. Each group of t storage devices contains extra parities to correct extra erasures in addition to erasures corrected by vertical parities in each m×t subarray.

In one embodiment, process 3900 may include that the extra parities comprise horizontal parities that are added to one of the number of w storage device arrays, and the extra horizontal parities are shared by the number of w storage device arrays for correcting extra columns in one of the plurality of w storage device arrays in addition to correction provided by the horizontal parities in the one of the plurality of w storage device arrays.

In one embodiment, process 3900 may include that each row and each column of each the number of w storage device arrays are protected by a single parity erasure-correcting code. In one embodiment, each m×t subarray contains one extra parity for correcting two erasures in a column in each m×t subarray.

In one embodiment, process 3900 may further include adding an extra parity column to one of the number of w storage device arrays, where the added extra parity column is shared among all of the number of w storage device arrays for correcting two erased columns in one of the plurality of w storage device arrays. In one embodiment, each entry in the number of w storage device arrays corresponds to an element in a finite field GF (q), and q is a positive integer larger or equal to m and n. In one example, each entry in the number of w storage device arrays corresponds to an element in a field or ring of binary polynomials modulo $1+x+x^2+\ldots+x^{p-1}$, where p is a prime number larger or equal to m and n, and x is a positive integer. In one embodiment, a minimum distance of the erasure-correcting code is 8.

In one embodiment, process 3900 provides that correcting erasures includes iteratively repeating, for each of the number of w storage device arrays until no further erasures are correctable in each array, hierarchical erasure correction including: correcting column erasures whenever possible in each of the plurality of w storage device arrays; correcting extra erasures in subarrays of t consecutive columns whenever possible; and correcting extra erasures using horizontal parity whenever possible; and then correcting extra erasures in one array of the number of w storage device arrays using the shared parity in addition to local parities in the one array. In one embodiment, process 3900 may further include determining an uncorrectable pattern when erasure correcting capability of the erasure-correcting code has been exceeded.

Figure 40:
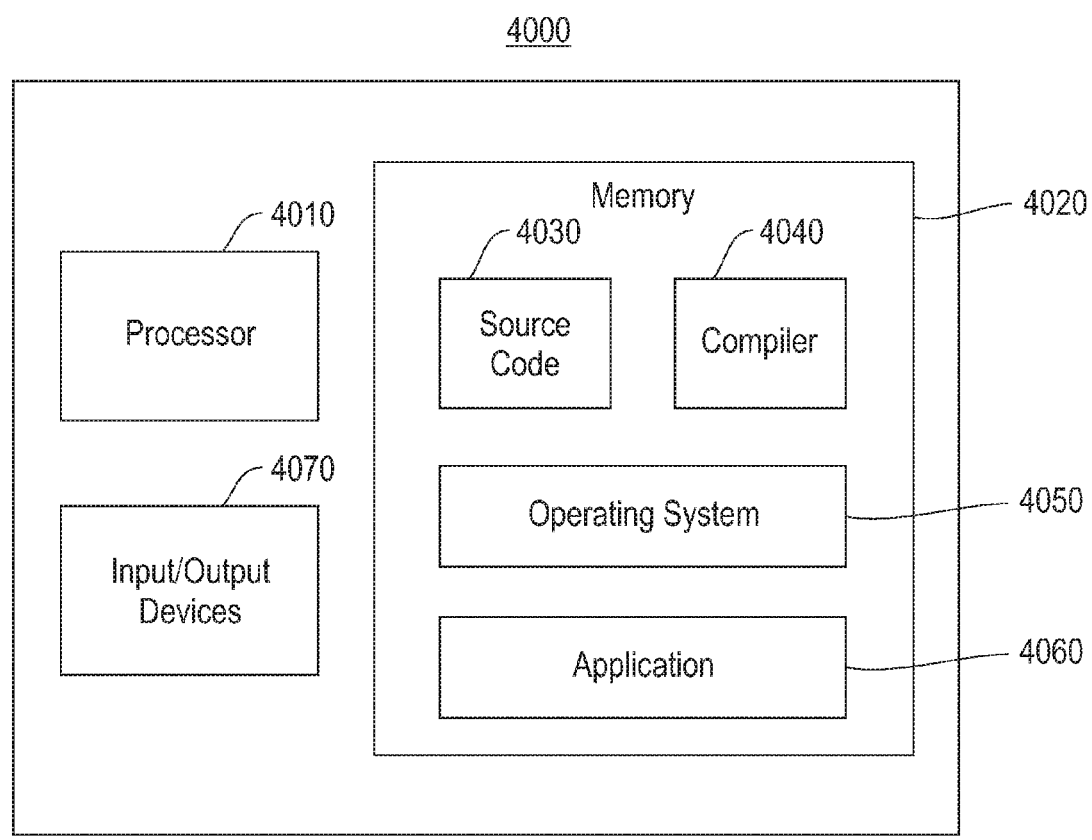
FIG. 40 illustrates an embodiment of a computer system that may be used in conjunction with embodiments with additional parities to correct erasures for data recovery, according to one embodiment.

FIG. 40 illustrates an example of a computer 4000 which may be utilized by exemplary embodiments of first responder parity for a storage array. Various operations discussed above may utilize the capabilities of the computer 4000. One or more of the capabilities of the computer 4000 may be incorporated in any element, module, application, and/or component discussed herein.

The computer 4000 includes, but is not limited to, PCs, workstations, laptops, PDAs, palm devices, servers, storages, and the like. Generally, in terms of hardware architecture, the computer 4000 may include one or more processors 4010, memory 4020, and one or more I/O devices 4070 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 4010 is a hardware device for executing software that can be stored in the memory 4020. The processor 4010 can be virtually any custom made or commercially available processor, a central processing unit (CPU), a digital signal processor (DSP), or an auxiliary processor among several processors associated with the computer 4000, and the processor 4010 may be a semiconductor based microprocessor (in the form of a microchip) or a macroprocessor.

The memory 4020 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 4020 may incorporate electronic, magnetic, optical, and/or other types of storage media. Note that the memory 4020 can have a distributed architecture, where various components are situated remote from one another, but can be accessed by the processor 4010.

The software in the memory 4020 may include one or more separate programs, each of which comprises an ordered listing of executable instructions for implementing logical functions. The software in the memory 4020 includes a suitable operating system (O/S) 4050, compiler 4040, source code 4030, and one or more applications 4060 in accordance with exemplary embodiments. As illustrated, the application 4060 comprises numerous functional components for implementing the features and operations of the exemplary embodiments. The application 4060 of the computer 4000 may represent various applications, computational units, logic, functional units, processes, operations, virtual entities, and/or modules in accordance with exemplary embodiments, but the application 4060 is not meant to be a limitation.

The operating system 4050 controls the execution of other computer programs, and provides scheduling, input-output control, file and data management, memory management, and communication control and related services. It is contemplated by the inventors that the application 4060 for implementing exemplary embodiments may be applicable on all commercially available operating systems.

Application 4060 may be a source program, executable program (object code), script, or any other entity comprising a set of instructions to be performed. When a source program, then the program is usually translated via a compiler (such as the compiler 4040), assembler, interpreter, or the like, which may or may not be included within the memory 4020, so as to operate properly in connection with the O/S 4050. Furthermore, the application 4060 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 4070 may include input devices such as, for example but not limited to, a mouse, keyboard, scanner, microphone, camera, etc. Furthermore, the I/O devices 4070 may also include output devices, for example but not limited to a printer, display, etc. Finally, the I/O devices 4070 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 4070 also include components for communicating over various networks, such as the Internet or intranet.

If the computer 4000 is a PC, workstation, intelligent device or the like, the software in the memory 4020 may further include a basic input output system (BIOS) (omitted for simplicity). The BIOS is a set of essential software routines that initialize and test hardware at startup, start the O/S 4050, and support the transfer of data among the hardware devices. The BIOS is stored in some type of read-only-memory, such as ROM, PROM, EPROM, EEPROM or the like, so that the BIOS can be executed when the computer 4000 is activated.

When the computer 1200 is in operation, the processor 4010 is configured to execute software stored within the memory 4020, to communicate data to and from the memory 4020, and to generally control operations of the computer 4000 pursuant to the software. The application 4060 and the O/S 4050 are read, in whole or in part, by the processor 4010, perhaps buffered within the processor 4010, and then executed.

When the application 4060 is implemented in software it should be noted that the application 4060 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 4060 can be embodied in any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any means that can store the program for use by or in connection with the instruction execution system, apparatus, or device. The computer readable storage medium can be, for example but not limited to, an electronic, magnetic, optical, electromagnetic, or semiconductor system, apparatus, or a device.

More specific examples (a nonexhaustive list) of the computer-readable storage medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable storage medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 4060 is implemented in hardware, the application 4060 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In one or more embodiments, technical effects and benefits include correction of errors in a storage array by reading from a reduced number of storage devices of the storage array.

As will be appreciated by one skilled in the art, aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for distributed hierarchical data recovery processing comprising:
    distributively encoding data stored in a storage system using an erasure-correcting code including:
        computing, by at least one global controller of the storage system, horizontal parities, local parities and shared parities from the data; and
        distributing computing of vertical parities from the data to a plurality of local controllers of a plurality of storage devices in the storage system, wherein distributing computing between the at least one global controller and the plurality of storage devices in the storage system improves scalability of the storage system;
    distributing the encoded data into a plurality of w storage device arrays in the storage system, each storage device array including n storage devices, each storage device divided into m sectors or pages;
    grouping the n storage devices into l groups of t storage devices each; and
    correcting data erasures that occurred in the plurality of w storage device arrays by recovering erased data using the erasure-correcting code of un-erased data based on each row and column in each m×n array being protected by the erasure-correcting code for the data, wherein each group of t storage devices contains extra second responder parities to correct extra data erasures in addition to data erasures corrected by first responder vertical parities in each m×t subarray, a data erasure being corrected by invoking a single storage device in the plurality of w storage device arrays where a single data erasure occurred, for two data erasures a second responder corrects the two data erasures by invoking at most a group of t consecutive storage devices, the second responder increasing a minimum distance of the erasure-correcting code, the distance measuring correcting-capability of the erasure-correcting code, and w, n, m, l and t are positive integers.

2. The method of claim 1, wherein the extra second responder parities comprise horizontal parities that are added to one of the plurality of w storage device arrays, and the extra horizontal parities are shared by the plurality of w storage device arrays for correcting extra columns in one of the plurality of w storage device arrays in addition to correction provided by the horizontal parities in the one of the plurality of w storage device arrays.

3. The method of claim 2, wherein each row and each column of each the plurality of w storage device arrays are protected by a single parity erasure-correcting code.

4. The method of claim 3, wherein each m×t subarray contains one extra parity for correcting two data erasures in a column in each m×t subarray.

5. The method of claim 4, further comprising:
adding an extra parity column to one of the plurality of w storage device arrays, wherein the added extra parity column is shared among all of the plurality of w storage device arrays for correcting two erased columns in one of the plurality of w storage device arrays.

6. The method of claim 5, wherein a minimum distance of the erasure-correcting code is 8, and the erasure-correcting code recovers up to 7 data erasures wherever the 7 data erasures are located in a particular storage array of the plurality of w storage device arrays.

7. The method of claim 2, wherein correcting data erasures comprises iteratively repeating, for each of the plurality of w storage device arrays until no further data erasures are correctable in each of the plurality of w storage device arrays, hierarchical erasure correction including:
correcting column erasures whenever possible in each of the plurality of w storage device arrays;
correcting extra data erasures in sub arrays of t consecutive columns whenever possible; and
correcting extra data erasures using horizontal parity whenever possible; and
correcting extra data erasures in one array of the plurality of w storage device arrays using the shared parity in addition to local parities in the one array of the plurality of w storage device arrays.

8. The method of claim 7, further comprising determining an uncorrectable pattern when erasure correcting capability of the erasure-correcting code has been exceeded.

9. A system including an array of storage devices comprising:
a plurality of w storage device arrays, each storage device array including n storage devices, and each storage device is divided into m sectors or pages;
a global storage controller for the system that encodes data by computing horizontal parities, local parities and shared parities from data stored in the plurality of w storage device arrays;
a plurality of local storage controllers that each distributively encode the data by computing vertical parities from the data, wherein each storage device array of the plurality of w storage device arrays includes a local storage controller, and distributing computing of parities between the global storage controller and each of the plurality of w storage device arrays improves scalability of the system;
a processor configured to:
distribute the encoded data into the plurality of w storage device arrays; and
correct data erasures that occurred in the plurality of w storage device arrays by recovering erased data using erasure-correcting code of un-erased data, wherein each row and column in each m×n array is protected with the erasure-correcting code for the data, and extra second responder horizontal parities added to one of the plurality of w storage device arrays and shared by the plurality of w storage device arrays are used to correct extra columns in any of the plurality of w storage device arrays in addition to data erasures corrected by first responder horizontal parities in the one of the plurality of w storage device arrays, each group of t storage devices contains extra second responder parities to correct extra data erasures in addition to data erasures corrected by first responder vertical parities in each m×t subarray, the processor corrects a data erasure by invoking a single storage device in the plurality of w storage device arrays where a single data erasure occurred, for two data erasures a second responder corrects the two data erasures by invoking at most a group of t consecutive storage devices, and the second responder increases a minimum distance of the erasure-correcting code, the distance measuring correcting-capability of the erasure-correcting code, where w, n, m and t, are positive integers.

10. The system of claim 9, wherein the n storage devices in each of the plurality of w storage device arrays are grouped into l groups of t storage devices each, where l is a positive integer.

11. The system of claim 10, wherein each row and each column of each of the plurality of w storage device arrays are protected by a single parity erasure-correcting code, and each m×t sub array contains one extra parity for correcting two data erasures in a column in each m×t subarray.

12. The system of claim 11, wherein the processor is further configured to add an extra parity column to one of the plurality of w storage device arrays, and the added extra parity column is shared among all of the plurality of w storage device arrays for correcting two erased columns in one of the plurality of w storage device arrays.

13. The system of claim 10, wherein the global storage controller is configured to send column symbols to a particular local storage controller, and the particular local storage controller is configured to determine vertical parities associated with the column symbols.

14. The system of claim 13, wherein the processor is configured to recover from a loss of a data symbol in one of the n storage devices based on using a vertical parity equation to correct a data erasure in a local storage controller associated with a particular storage device.

15. A computer program product for distributed hierarchical correction coding, the computer program product comprising a computer readable storage device having program instructions embodied therewith, the program instructions executable by a processor to cause the processor to:
distributively encode, by the processor, data stored in a storage system using an erasure-correcting code and at least one global controller to compute, horizontal parities, local parities and shared parities from the data;
distributing computing of vertical parities from the data by a plurality of local storage controllers of the plurality of storage devices in the storage system, wherein distributing computing of parities between the at least one global controller and the plurality of local storage controllers improves scalability of the storage system;
distribute, by the processor, the encoded data into a plurality of w storage device arrays in the storage system, each storage device array including n storage devices, each storage device divided into m sectors or pages;
group, by the processor, the n storage devices into l groups of t storage devices each; and
correct data erasures, by the processor, that occurred in the plurality of w storage device arrays by recovering erased data using the erasure-correcting code of un-erased data based on each row and column in each m×n array being protected by the erasure-correcting code for the data, wherein each group of t storage devices contains extra second responder parities to correct extra data erasures in addition to data erasures corrected by first responder vertical parities in each m×t subarray, a data erasure being corrected by invoking a single storage device in the plurality of w storage device arrays where a single data erasure occurred, for two data erasures a second responder corrects the two data erasures by invoking at most a group of t consecutive storage devices, the second responder increasing a minimum distance of the erasure-correcting code, and the distance measuring correcting-capability of the erasure-correcting code, and w, n, m, l and t are positive integers.

16. The computer program product of claim 15, wherein the extra second responder parities comprise horizontal parities that are added to one of the plurality of w storage device arrays, and the extra second responder horizontal parities are shared by the plurality of w storage device arrays for correcting extra columns in one of the plurality of w storage device arrays in addition to correction provided by the first responder horizontal parities in the one of the plurality of w storage device arrays.

17. The computer program product of claim 16, wherein:
each row and each column of each the plurality of w storage device arrays are protected by a single parity erasure-correcting code; and
each m×t subarray contains one extra parity for correcting two data erasures in a column in each m×t subarray.

18. The computer program product of claim 17, further comprising program instructions executable by the processor to cause the processor to:
add, by the processor, an extra parity column to one of the plurality of w storage device arrays, wherein the added extra parity column is shared among all of the plurality of w storage device arrays for correcting two erased columns in one of the plurality of w storage device arrays.

19. The computer program product of claim 18, wherein a minimum distance of the erasure-correcting code is 8, and the erasure-correcting code recovers up to 7 data erasures wherever the 7 data erasures are located in a particular storage device array of the plurality of w storage device arrays.

20. The computer program product of claim 15, wherein correction of data erasures further comprising program instructions executable by the processor to cause the processor to:
iteratively repeat, by the processor, for each of the plurality of w storage device arrays until no further data erasures are correctable in each storage device array of the plurality of w storage device arrays, hierarchical erasure correction including:
correcting column erasures whenever possible in each of the plurality of w storage device arrays;
correcting extra erasures in subarrays of t consecutive columns whenever possible;
correcting extra data erasures using horizontal parity whenever possible; and
correcting extra data erasures in one storage device array of the plurality of w storage device arrays using the shared parity in addition to local parities in the one storage device array.

* * * * *